United States Patent
Yamashita et al.

[11] Patent Number: 6,067,256
[45] Date of Patent: May 23, 2000

[54] STATIC SEMICONDUCTOR MEMORY DEVICE OPERATING AT HIGH SPEED UNDER LOWER POWER SUPPLY VOLTAGE

[75] Inventors: Masayuki Yamashita; Hideki Kawamura, both of Hyogo, Japan

[73] Assignee: Mitsubishi Denki Kabushiki Kaisha, Tokyo, Japan

[21] Appl. No.: 09/072,138

[22] Filed: May 5, 1998

[51] Int. Cl.[7] .................................................. G11C 16/04
[52] U.S. Cl. ............................. 365/189.04; 365/189.08
[58] Field of Search ....................... 365/189.04, 230.08, 365/203, 207, 189.11, 230.05, 189.03

[56] References Cited

U.S. PATENT DOCUMENTS

| | | | |
|---|---|---|---|
| 4,730,279 | 3/1988 | Ohtani | 365/203 |
| 4,751,680 | 6/1988 | Wang et al. | 365/203 |
| 5,666,324 | 9/1997 | Kosugi et al. | 365/233 |
| 5,724,292 | 3/1998 | Wada | 365/207 |

FOREIGN PATENT DOCUMENTS

| | | |
|---|---|---|
| 8-77780 | 1/1989 | Japan . |
| 6-259968 | 9/1994 | Japan . |
| 7-130177 | 5/1995 | Japan . |
| 64-13288 | 3/1996 | Japan . |

*Primary Examiner*—David Nelms
*Assistant Examiner*—Thong Le
*Attorney, Agent, or Firm*—McDermott, Will & Emery

[57] ABSTRACT

A bit line load element for reducing a bit line amplitude during data reading is formed of p- and n-channel MOS transistors connected in parallel. When a word line is driven to the selected state, the p-channel MOS transistor is held off. In the data write operation, both the n- and p-channel MOS transistors are turned off. Even under a low power supply voltage, a sufficiently large bit line amplitude can be produced without an influence by a size of the bit line load element. By deactivating the bit line load element in the data write operation, it is possible to prevent generation of a DC current during data writing.

16 Claims, 17 Drawing Sheets

FIG. 9
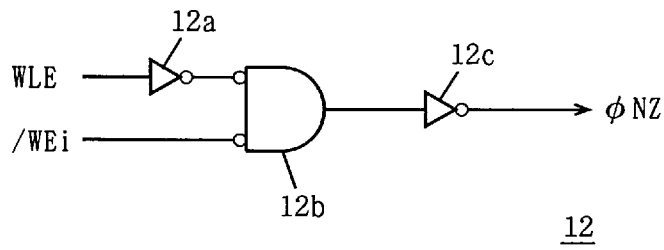
FIG. 11
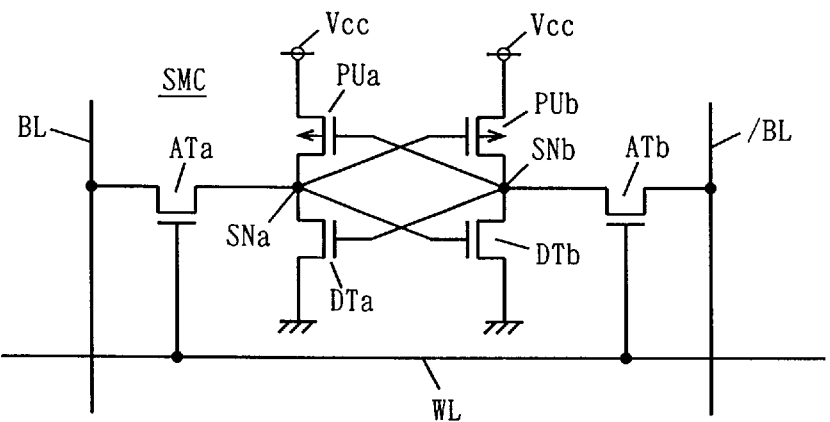
FIG. 12A   FIG. 12B   FIG. 12C
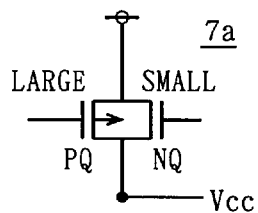
WLE="L"
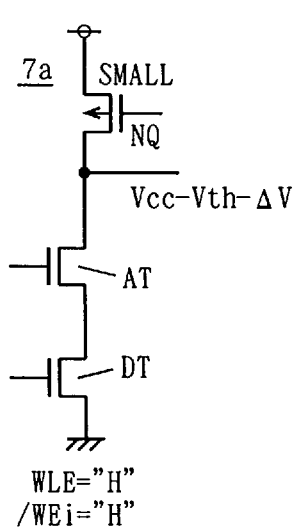
WLE="H"
/WEi="H"
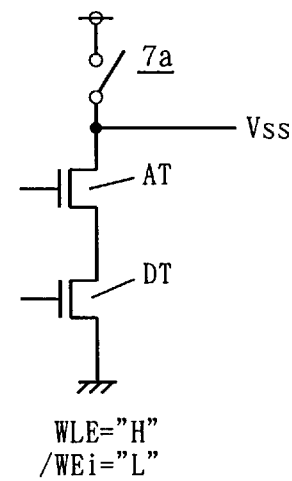
WLE="H"
/WEi="L"

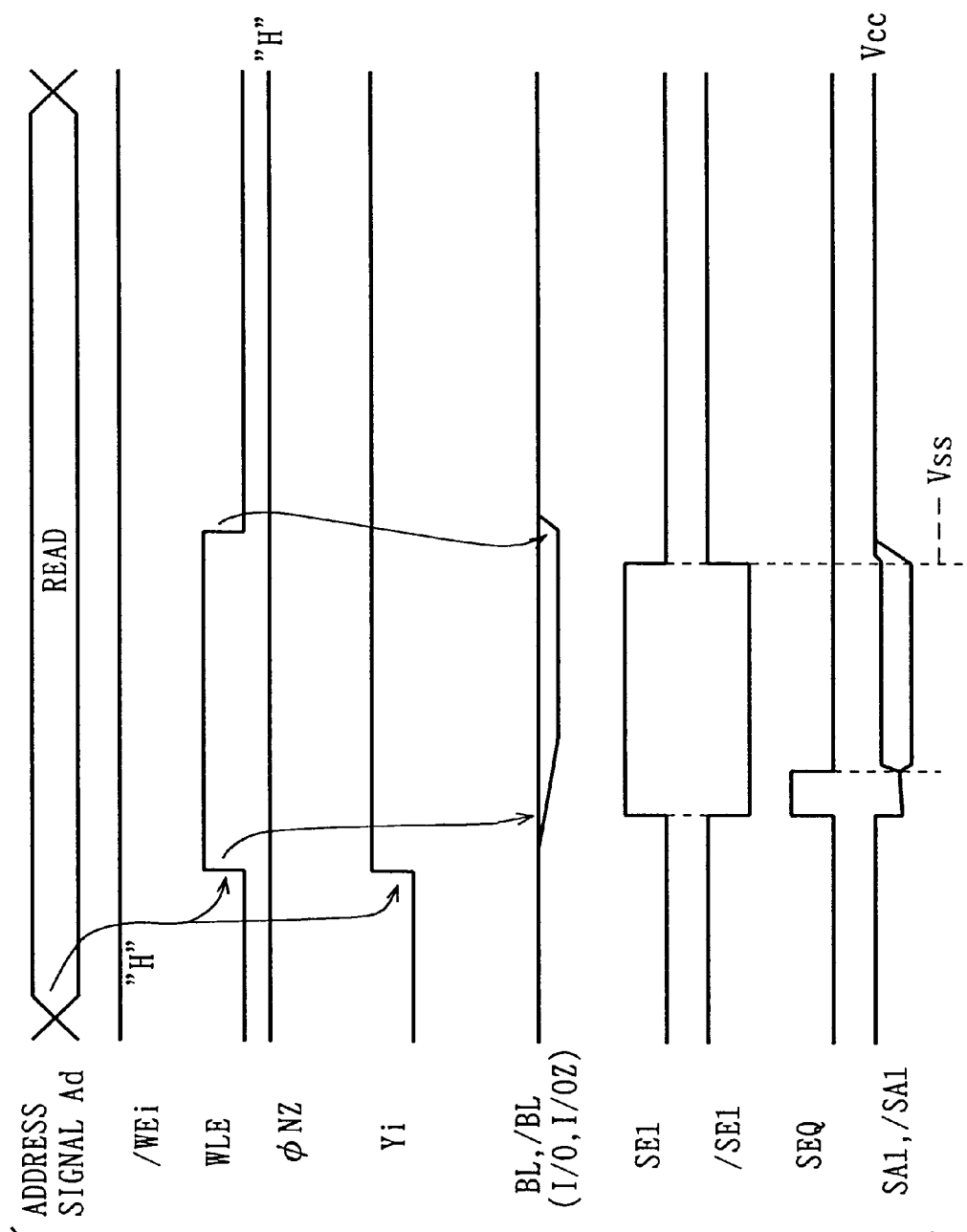
F I G. 2 2

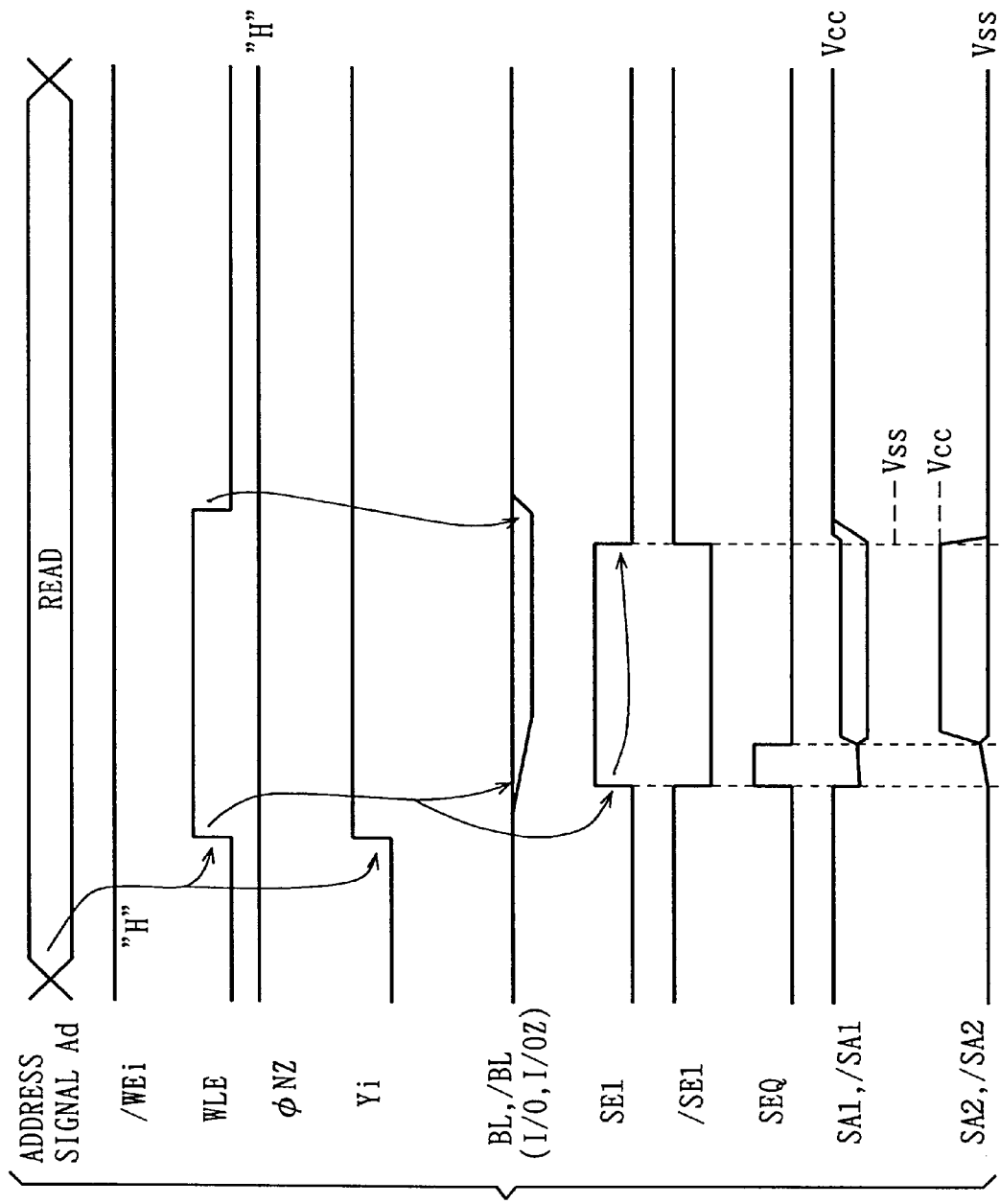
F I G. 25

STATIC SEMICONDUCTOR MEMORY DEVICE OPERATING AT HIGH SPEED UNDER LOWER POWER SUPPLY VOLTAGE

BACKGROUND OF THE INVENTION

1. Field of the Invention

The present invention relates to a semiconductor memory device, and particularly to a static semiconductor memory device which operates fast and stably even under a low power supply voltage. Specifically, the invention relates to structures of a bit line load circuit and a data read circuit of the static semiconductor memory device.

2. Description of the Background Art

FIG. 1 schematically shows a structure of a main portion of a semiconductor memory device in the prior art. In FIG. 1, the semiconductor memory device includes a plurality of Static Random Access Memory cells (SRAM cells) SMCs arranged in rows and columns, a plurality of word lines WLs which are arranged corresponding to the rows of memory cells, respectively, and are connected to SRAM cells SMC in the corresponding rows, and a plurality of pairs of bit lines BLs and /BLs which are arranged corresponding to the columns of SRAM cells, respectively, and are connected to SRAM cells SMCs in the corresponding columns. FIG. 1 shows representatively SRAM cells SMCs arranged in two rows and two columns. Word lines WL0 and WL1 are arranged corresponding to the rows, respectively. Bit line pairs BL0, /BL0 and BL1, /BL1 are arranged corresponding to the columns, respectively.

The semiconductor memory device further includes column select gates CG0, CG1, . . . which are provided corresponding to bit line pairs BLP0, BLP1, . . . and connect the corresponding bit line pairs to an internal data bus IOB in response to column select signals Y0, Y1, . . . , respectively, and bit line load circuits LKs which are provided corresponding to bit lines BL0 and /BL0, BL1 and /BL1, . . . , respectively. Each bit line load circuit LK holds the potentials on the corresponding bit line pair at a power supply voltage Vcc level during standby, and restricts a voltage swing of the corresponding bit line pair during data reading.

Each of column select gates CG0, CG1, . . . , includes n-channel MOS transistors Ts, each of which in turn is connected between a bit line of the corresponding bit line pair and internal data bus IOB, and receives on its gate a corresponding column select signal. Bit line load circuit LK includes n-channel MOS transistors Qs provided corresponding to the bit lines, respectively, and each having a gate and a drain connected to a power supply node as well as a source connected to a corresponding bit line. Internal data bus IOB is coupled to a data I/O circuit WRC which performs reception and transmission of external data. An operation of the semiconductor memory device shown in FIG. 1 will be described below with reference to a signal waveform diagram of FIG. 2.

At time t0, an external address signal extATD, e.g., at a TTL level changes, and an internal address signal intAd generated from an address input buffer (not shown) changes at time t1. The internal signal of the semiconductor memory device is at an MOS level. A row decode circuit (not shown) performs decoding in accordance with internal address signal intAd, and drives a word line WL corresponding to the addressed row to the selected state at time t2. In parallel with rising in potential on the selected word line, the potential on the deselected word line lowers, and changes from the selected state to the unselected state. Also, in parallel with this selection of the word line, column selection is performed in accordance with internal address signal intAd, a column select gate provided for the bit line pair corresponding to the addressed column is turned on in response to column select signal (Y0, Y1, . . . ), and the addressed bit line pair is connected to internal data bus IOB. When word line WL is driven to the selected state, data stored in the SRAM cells are read onto the corresponding bit line pairs BLPs (BLP0, BLP1, . . . ), and the potential change on the selected bit line pair is transmitted onto internal data bus IOB through the column select gate in the on state so that the potential on internal data bus IOB changes at time t3.

When the potential on internal data bus IOB becomes stable, a sense amplifier included in data I/O circuit WRC operates to amplify the signal on internal data bus IOB, and then read data DOUT (DQ) is output through an output buffer circuit included in data I/O circuit WC at time t5.

The semiconductor memory device statically performs an operation in accordance with a received address signal, to read out the data stored in the SRAM cells 1 and therefore can perform fast data reading. This is because it is not necessary to provide a standby cycle for precharging internal signal lines between the successive operations of selecting the memory cells.

FIG. 3 shows an example of a structure of SRAM cell SMC shown in FIG. 1. In FIG. 3, SRAM cell SMC includes cross-coupled driver transistors DTa and DTb for storing data on storage nodes SNa and SNb, high resistance load elements Za and Zb having high resistances for pulling up storage nodes SNa and SNb to power supply voltage Vcc level, and access transistors ATa and ATb for connecting storage nodes SNa and SNb to bit lines BL and /BL, respectively. Driver transistor DTa has a gate connected to storage node SNb, a drain connected to storage node SNa and a source connected to a ground node. Driver transistor DTb has a gate connected to storage node SNa, a drain connected to storage node SNb and a source connected to the ground node. Access transistors ATa and ATb are formed of n-channel MOS transistors, respectively, and are turned on when the potential on word line WL is at H-level (logically high level). Each of high resistance load elements Za and Zb is made of polycrystalline silicon having a high resistance. Now, operations for reading and writing data from and into the SRAM cell shown in FIG. 3 will be described below with reference to a signal waveform diagram of FIG. 4.

When word line WL has a potential thereon raised to be selected, access transistors ATa and ATb are turned on, and storage nodes SNa and SNb are connected to bit lines BL and /BL, respectively. It is now assumed that data at H-level is stored on storage node SNa, and data at L-level is stored on storage node SNb. Bit lines BL and /BL have been precharged to the voltage level of (Vcc−Vth), where Vth represents a threshold voltage of the bit line load transistor Q.

When storage node SNa is at H-level, the voltage level on storage node SNa is held at power supply voltage Vcc level by high resistance load element Za. Storage node SNb is at the ground voltage level, and driver transistor DTa is off. Therefore, even if storage node SNa is connected to bit line BL through access transistor ATa, a current does not flow to bit line BL, and bit line BL maintains the precharge voltage level of (Vcc−Vth).

Driver transistor DTb is on due to the H-level of data on storage node SNa, and a DC current flows from bit line load transistor Q to the ground node through access transistor ATb and driver transistor DTb. This DC current is called a column current, and lowers the voltage level on bit line /BL. The voltage level on bit line /BL is determined by the resistance division through the channel resistance of bit line load transistor and the channel resistances of access and driver transistors ATb and DTb. Therefor, the voltage level of bit line /BL further lowers from the precharge voltage (Vcc−Vth) by a voltage ΔV which is called a bit line amplitude. This voltage difference ΔV between bit lines BL and /BL is transmitted onto internal data bus IOB shown in FIG. 1, and is amplified by the sense amplifier included in data I/O circuit WRC for reading out.

When one memory cycle is completed, the potential on word line WL lowers to L-level so that access transistors ATa and ATb are turned off, and storage nodes SNa and SNb are isolated from bit lines BL and /BL. The storage node SNb, which has a voltage level raised when accessed, is driven to the ground voltage level again by driver transistor DTb when access transistor ATb is off. Bit line load transistor Q raises the voltage, (Vcc−Vth−ΔV), on bit line /BL to the level of original precharge voltage (Vcc−Vth).

For data writing, word line WL is selected, and storage nodes SNa and SNb are connected to bit lines BL and /BL, respectively, as is done in the data read operation. A column current flows to one of bit lines BL and /BL to lower the potential on the one bit line. In this state, the write driver included in data I/O circuit WRC shown in FIG. 1 drives bit lines BL and /BL to the precharge voltage (Vcc−Vth) level and the ground voltage Vss level in accordance with the write data, respectively. Even when the H-level of output signal of the write driver is equal to power supply voltage Vcc level, the bit line at H-level is at the voltage equal to the precharge voltage (Vcc−Vth) as a result of the threshold voltage loss at column select gate CG. Here, it is assumed that transistor T of the column select gate is equal in threshold voltage to bit line load transistor Q.

FIG. 5 shows a path through which a column current flows to one bit line BL or /BL. Bit line load transistor Q is connected between the power supply node and bit line BL (/BL). Access transistor AT and driver transistor DT are connected in series between bit line BL and the ground node. In a standby cycle, access transistor AT and driver transistor DT are off, and bit line load transistor Q maintains bit line BL (or /BL) at the voltage level of (Vcc−Vth). In this state, column select gate CG is off, and bit line BL (or /BL) is connected to the power supply node by bit line load transistor Q.

When the memory cell is selected, access transistor AT and driver transistor DT are both turned on, assuming that the gate voltage of driver transistor DT is at H-level. In this case, the column current flows from the power supply node to the ground node through transistors Q, AT and DT. It is assumed that bit line load transistor Q has a channel resistance of Rq, access transistor AT has a channel resistance of Ra and driver transistor DT has a channel resistance of Rd. In this case, bit line BL carries a voltage expressed by the following representation:

$Vcc-Vth-Vcc \cdot Rq/(Ra+Rd+Rq)$

It is necessary to increase bit line amplitude ΔV as large as possible for correct data reading. However, if the level of power supply voltage Vcc lowers, bit line amplitude ΔV (third term in the above representation) decreases, and the sense amplifier margin decreases so that it becomes difficult to read correctly the memory cell data.

In the data write operation, the potential on bit line driven to L-level is pulled up to the level of precharge voltage (Vcc−Vth) only by bit line load transistor Q formed of the n-channel MOS transistor. For rapidly precharging the bit line after the data writing and reading, it is desired to increase a size (channel width) of bit line load transistor Q and thereby to increase its current driving capability. If the precharging period (recovery period) of this bit line is long, next access cannot be started at an early timing, and further a conflict of data may occur on the bit line.

If the size of bit line load transistor Q is increased to increase its current driving capability, channel resistances Ra and Rd of access transistor AT and driver transistor DT raise the L-level voltage on the bit line carrying the column current. Therefore, a sufficiently large voltage difference cannot be produced between bit lines BL and /BL, and an accurate sense operation cannot be performed. If the current driving capability is increased slightly so as not to bring about the above-described state, a relatively long time is required before a sufficiently large read voltage (bit line amplitude) is produced, which results in delay in timing of activating the sense amplifier, and impedes the fast access.

If the current driving capability of the bit line load transistor is increased as described above, the bit line receiving an L-level data is driven to the ground voltage level when the write driver operates in the data operation. This increases the DC current which flows from the power supply node through the bit line load transistor and the write driver, and increases the current consumption.

SUMMARY OF THE INVENTION

An object of the invention is to provide a semiconductor memory device which can stably perform fast write/read of data even under a low power supply voltage.

Another object of the invention is to provide a semiconductor memory device which can rapidly precharge bit lines.

Still another object of the invention is to provide a semiconductor memory device which operates fast without increasing a current consumption even under a low power supply voltage.

A semiconductor memory device according to the invention includes bit line load elements to be turned off during data writing and each having a current driving capability reduced below that during standby. Each of the bit line load elements includes a p-channel MOS transistor and an n-channel MOS transistor connected in parallel with each other.

During the data writing, the bit line load element is turned off to cut off a path of flow of a column current to the bit line so that generation of a DC current during the data writing can be prevented. During the data reading, the current driving capability of the bit line load element is reduced below that during standby so that the voltage level at L-level during the data reading can be made sufficiently low.

When the p-channel MOS transistor is turned off during both the data writing and the data reading, the channel width (a ratio between the channel width and a channel length) of the p-channel MOS transistor can be made large, so that bit line recovery can be performed rapidly after the data writing and data reading. Even under the low power supply voltage, the bit line load element has a current supply capability sufficiently reduced and therefore a sufficiently large bit line amplitude can be achieved even under the low power supply voltage.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 schematically shows a structure of a portion for generating a bit line load control signal shown in FIG. 8;

FIG. 11 shows an example of a structure of an SRAM cell shown in FIG. 8;

FIGS. 12A to 12C schematically illustrate a switching operation of a bit line load element in an embodiment of the invention;

FIG. 22 is a timing chart representing an operation of the read circuit shown in FIG. 21;

FIG. 25 is a timing chart representing a data read operation of the semiconductor memory device shown in FIG. 24;

DESCRIPTION OF THE PREFERRED EMBODIMENTS

Figure 6:
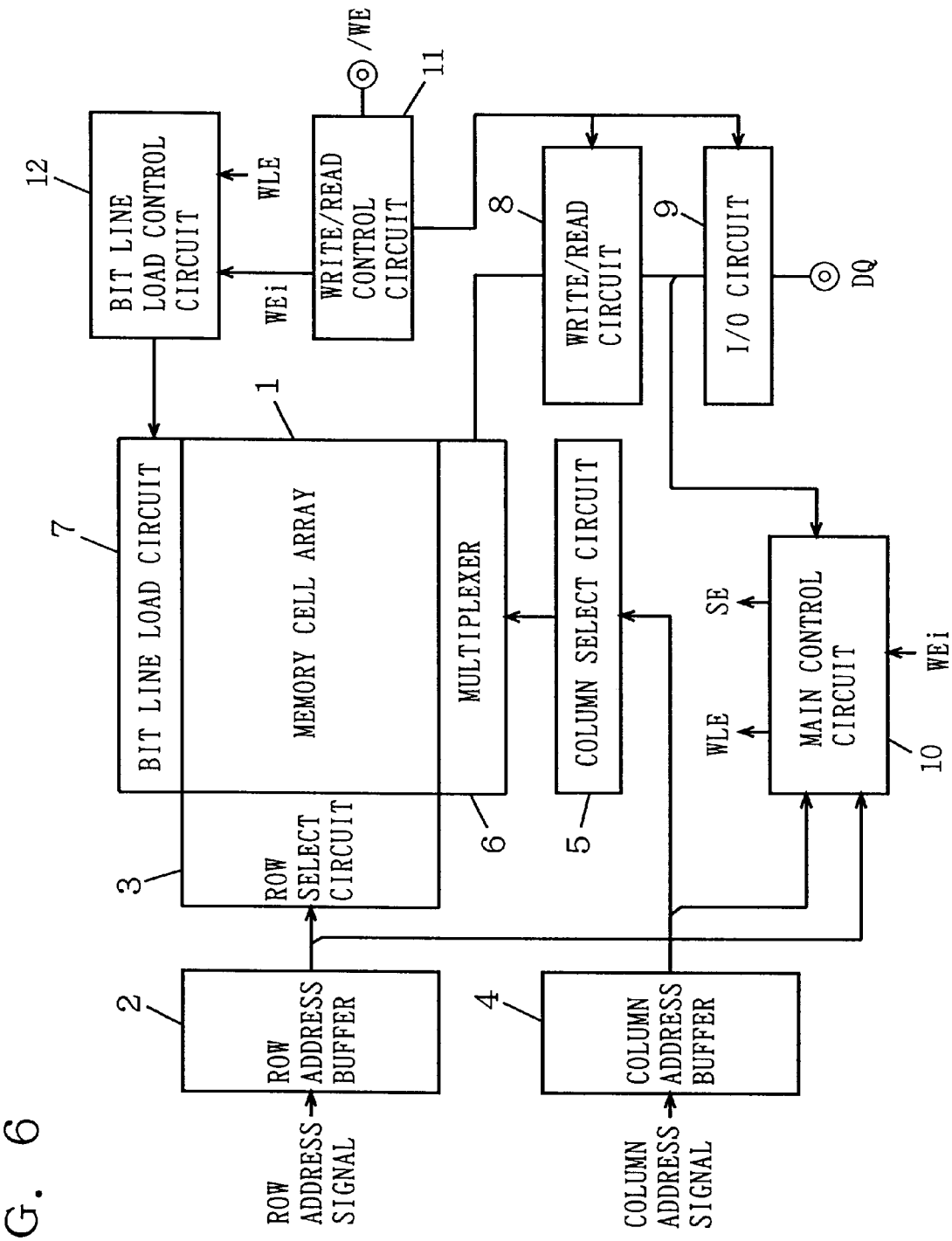
FIG. 6 schematically shows a whole structure of a semiconductor memory device according to an embodiment of the invention.

FIG. 6 is a block diagram schematically showing a whole structure of a semiconductor memory device according to an embodiment of the invention. In FIG. 6, the semiconductor memory device includes a memory cell array 1 having a plurality of static memory cells arranged in rows and columns, a row address buffer 2 for buffering an externally supplied row address signal to produce an internal row address signal, a row select circuit 3 for decoding the internal row address signal received from row address buffer to drive a word line arranged corresponding to the addressed row in memory cell array 1 to the selected state, a column address buffer 4 for buffering an externally applied column address signal to produce an internal column address signal, and a column select circuit 5 for decoding the internal column address signal received from column address buffer 4 to drive the addressed column in memory cell array 1 to the selected state.

The memory cell array 1 includes the word lines arranged corresponding to the rows of memory cells, respectively, and the bit line pairs arranged corresponding to the columns of memory cells, respectively. Row select circuit 3 includes a row decoder for decoding the internal row address signal, and word line drive circuits for driving a word lines arranged corresponding to an addressed row, to the selected state in accordance with the decoded signal received from the row decoder, respectively. Column select circuit 5 includes a decode circuit for decoding the internal column address signal received from column address buffer 4, to produce a column select signal for selecting a bit line arranged corresponding to the addressed column.

The semiconductor memory device further includes a multiplexer 6 for selecting the bit line pair corresponding to the addressed column in memory cell array 1 in accordance with the column select signal received from column select circuit 5, and bit line load circuits 7 arranged corresponding to the bit line pairs in memory cell array 1 for setting the bit line potentials according to the operation mode. Bit line load circuit 7, of which structure will be described later in detail, precharges the corresponding bit line to power supply voltage Vcc level during standby, is deactivated during the data writing, and is controlled to have a sufficiently reduced current supply capability during the data reading. By controlling the current supply amount of bit line load circuit 7 in accordance with the operation mode, the bit line amplitude is set to an optimum level even under a low power supply voltage, and a fast and stable operation is ensured.

The semiconductor memory device further includes a write/read circuit 8 coupled to the selected column in memory cell array 1 through multiplexer 6 for writing/reading data, and an I/O circuit 9 which performs external reception and transmission of data signals to and from write/read circuit 8. In the data write operation, write/read circuit 8 produces two pieces of data complementary to each other in accordance with data applied from I/O circuit 9, for transmission onto the bit line pair of the selected column through multiplexer 6. In the data read operation, write/read circuit 8 amplifies and applies the memory cell data read out through multiplexer 6 to I/O circuit 9.

The semiconductor memory device further includes a main control circuit 10 receiving the address signals from row and column address buffers 2 and 4, the input data from I/O circuit 9 and an internal write instructing signal WEi generated according to an externally applied write enable signal /WE. Main control circuit 10 generates (i.e., activates) a word line enable signal WLE and a sense amplifier enable signal SE for a predetermined period in response to change in received signals.

The semiconductor memory device also includes a write/read control circuit 11 for receiving word line enable signal WLE and externally supplied write enable signal /WE, to produce internal write instructing signal WEi for controlling operations of write/read circuit 8 and I/O circuit 9, and a bit line load control circuit 12 for controlling bit line load circuit 7 in accordance with word line enable signal WLE and internal write instructing signal WEi.

Figure 7:
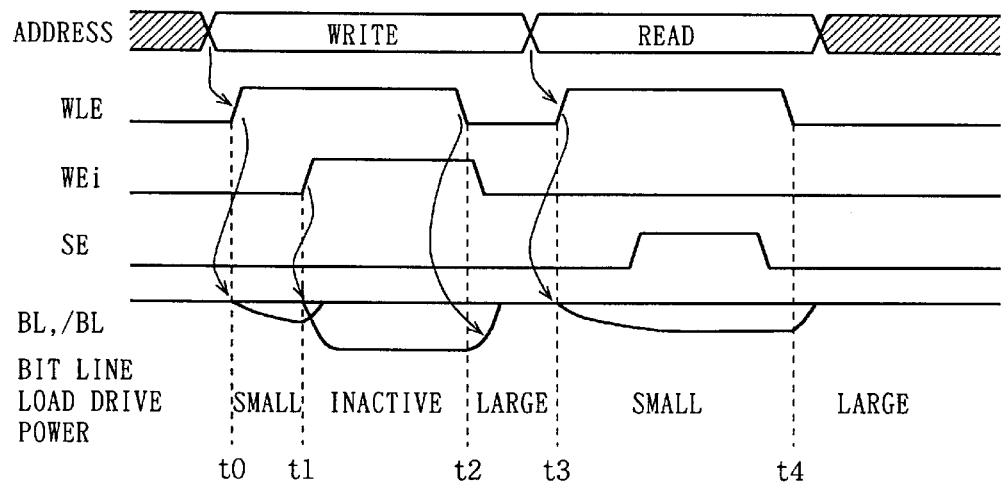
FIG. 7 is a signal waveform diagram representing an operation of a semiconductor memory device shown in FIG. 6.

An operation of the semiconductor memory device shown in FIG. 6 will be briefly described below with reference to FIG. 7.

When the address signal changes, main control circuit 10 detects a change in address signal, and maintains word line enable signal WLE active for a predetermined period starting from time t0. In accordance with this address signal, row select circuit 3 and column select circuit 5 perform the row and column selection, and data of the selected memory cell is read onto bit lines BL and /BL. In the data write operation, externally applied write enable signal /WE is activated to instruct the data writing at time t1, so that internal write instructing signal WEi from write/read control circuit 11 rises to H-level. In accordance with this activation of internal write instructing signal WEi, write/read circuit 8 writes the data onto the selected column in memory cell array 1 through multiplexer 6.

When word line enable signal WLE is deactivated at time t2, the voltage level on the selected word line is driven to the unselected state, column select circuit 5 is deactivated, and multiplexer 6 is turned off. In this state, bit line load circuit 7 precharges each bit line in memory cell array 1 to a predetermined voltage level (power supply voltage level).

When the address signal changes again at time t3, word line enable signal WLE rises to H-level, and data of the selected memory cell is read onto bit lines BL and /BL. Internal write instructing signal WEi is at L-level designating the data read mode. Upon elapsing of a predetermined period after rising of word line enable signal WLE, sense amplifier enable signal SE is kept active for a predetermined period, and write/read circuit 8 amplifies the selected memory cell data read through multiplexer 6, for application to I/O circuit 9. I/O circuit 9 buffers the received data, and produces external read data.

When word line enable signal WE is activated, bit line load circuit 7 is controlled by bit line load control circuit 12 to reduce its current driving capability. In the data write operation, bit line load circuit 7 is kept inactive while write/read circuit 8 actually writes the data into the memory cell, i.e., while word line enable signal WLE and internal write instructing signal WEi are both active. In this state, therefore, a path of flow of a DC current from bit line load circuit 7 to write/read circuit 8 is cut off so that a current consumption is reduced. When word line enable signal WLE is deactivated, the driving capability of bit line load circuit 7 is increased. Therefore, each bit line is rapidly precharged to the precharge voltage, and the bit line potential can be recovered rapidly.

In the data read operation, the current driving capability of bit line load circuit 7 is reduced in accordance with activation of word line enable signal WLE. Therefore, the low level potential on the bit line can be sufficiently low even under the low power supply voltage, and a sufficiently large bit line amplitude can be achieved even under the low power supply voltage.

Figure 1:
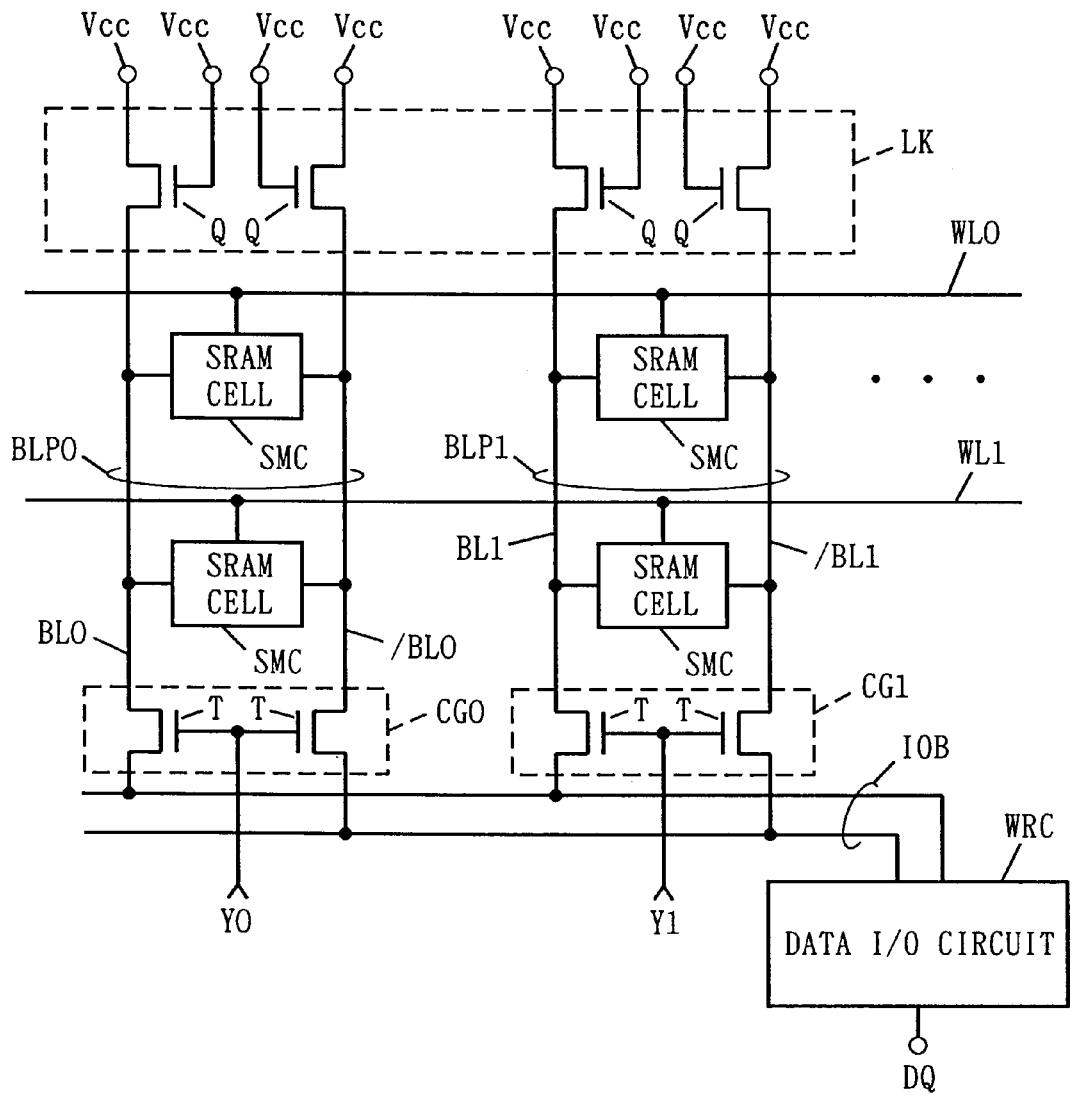
FIG. 1 schematically shows a structure of a cell array of a semiconductor memory device in the prior art.

In the structure shown in FIG. 1, the current driving capability of bit line load circuit 7 can be controlled according to the operation mode, and data of the memory cells can be read rapidly and stably with a low current consumption even under the low power supply voltage. Structures of various portions will now be described below in detail.

Structure of the Memory Cell Array

Figure 8:
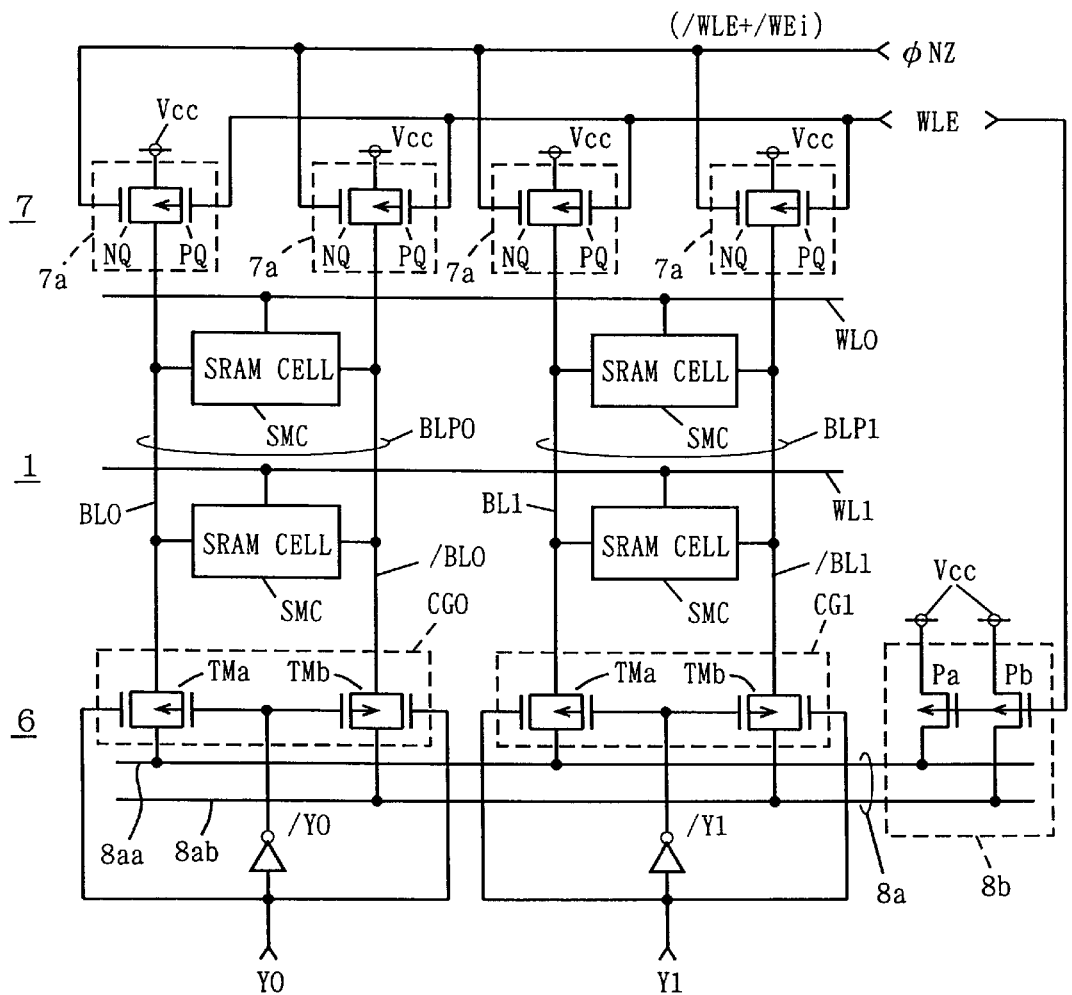
FIG. 8 schematically shows a structure of a main portion of the semiconductor memory device shown in FIG. 6.

FIG. 8 shows a structure of memory cell array 1 and its peripheral circuitry of the semiconductor memory device shown in FIG. 1. FIG. 8 shows by way of example SRAM cells SMCs arranged in two rows and two columns. Word lines WL0 and WL1 are arranged corresponding to the respective rows of SRAM cells SMC, and bit line pairs BLP0 and BLP1 are arranged corresponding to the columns of SRAM cells SMC, respectively. Bit line pair BLP0 has bit lines BL0 and /BL0, and bit line pair BLP1 has bit lines BL1 and /BL1.

Multiplexer 6 has column select gates CG0 and CG1 provided corresponding to bit line pairs BLP0 and BLP1 and turning on to connect corresponding bit line pairs BLP0 and BLP1 to internal data bus 8a in response to column select signals Y0 and Y1, respectively. Each of column select gates CG0 and CG1 includes a CMOS transmission gate TMa for turning on to connect corresponding bit line BL (BL0 or BL1) to a bus line 8aa of internal data bus 8a in response to complementary column select signals Y (Y0 or Y1) and /Y (/Y0 or /Y1), and a CMOS transmission gate TMb for turning on in response to complementary select signals Y and /Y to connect corresponding bit line /BL (/BL0 or /BL1) to a bus line 8ab of internal data bus 8a.

By utilizing CMOS transmission gates TMa and TMb as the column select gate, the H-level of bit lines BL and /BL can be set to power supply voltage Vcc level, and fast transmission of data signals between the selected bit line and internal data bus 8a can be performed owing to their large conductance, compared with a column select gate formed of one MOS transistor.

Internal data bus 8a is provided with an I/O line load circuit 8b, which in turn precharges internal data bus lines 8aa and 8ab to power supply voltage Vcc level in response to deactivation of word line enable signal WLE. I/O line load circuit 8b has p-channel MOS transistors Pa and Pb turning on to transmit power supply voltage Vcc to internal data bus lines 8aa and 8ab, respectively, when word line enable signal WLE is inactive.

Bit line load circuit 7 includes bit line load elements 7a, provided corresponding to respective bit lines BL and /BL and having current driving capabilities (conductances) controlled in response to a control signal φNZ and word line enable signal WLE. Bit line load element 7a has an n-channel MOS transistor NQ turning on, when control signal φNZ is at H-level to supply a current to corresponding bit line BL or /BL, and a p-channel MOS transistor PQ turning on when word line enable signal WLE is inactive, to supply a current to corresponding bit line BL or /BL from the power supply node. The current supply capability of n-channel MOS transistor NQ is sufficiently small.

FIG. 9 shows a structure of bit line load control circuit 12 for generating control signal φNZ. In FIG. 9, bit line load control circuit 12 includes an inverter 12a for inverting word line enable signal WLE applied from main control circuit 10 shown in FIG. 6, a NOR circuit 12b for receiving internal write instructing signal /WEi and the output signal of inverter 12a, and an inverter 12c for inverting the output signal of NOR circuit 12b to produce control signal φNZ. Internal write instructing signal /WEi is produced by buffering externally applied write instructing signal /WE. Therefore, control signal φNZ attains L-level and drives n-channel MOS transistor NQ of bit line load element 7a to the off state when the word line is in the selected state and internal write instructing signal /WEi is at L-level to instruct writing of data into the selected memory cell.

While word line enable signal WLE is at H-level, p-channel MOS transistor PQ of bit line load element 7a is off. When data is written into the selected memory cell in the data write operation, both MOS transistors NQ and PQ of bit line load element 7a are off, and only the selected bit line pair receives the write data. The bit lines of the remaining, or unselected bit line pairs receive data of the corresponding memory cells, respectively, and potentials of the bit lines receiving the data at L-level slightly lower. Now, an operation of the semiconductor memory device shown in FIG. 3 will be described below with reference to an operation waveform diagram of FIG. 10.

Figure 10:
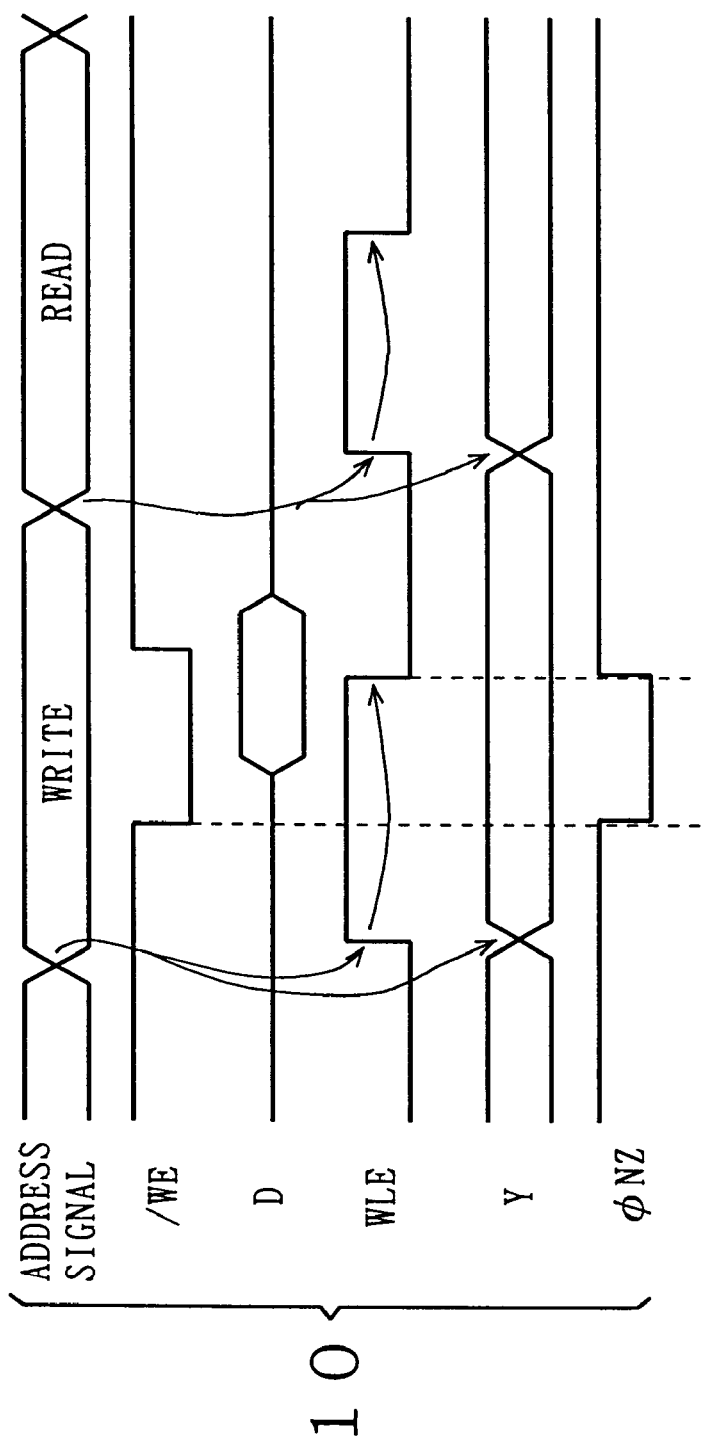
FIG. 10 is a signal waveform diagram representing an operation of a semiconductor memory device shown in FIG. 8.

First, the write operation will be described. Word line enable signal WLE is driven to the H-level of active state for a predetermined period in response to activation of at least one of a signal DTD activated in response to change in external write instructing signal /WE or input data signal Din, and an address transition detection signal ATD activated in response to detection of change in the external address signal. FIG. 10 shows by way of example an operation mode, in which word line enable signal WLE is activated for a predetermined period in response to transition in address signal, i.e., change in address. The word line selection is performed in accordance with the internal row address signal, and column select signal Y changes as a result of decoding by the column select circuit. The bit line pair provided corresponding to the selected column is connected to internal data bus 8a through corresponding column select gate CG (CG0 or CG1).

When word line enable signal WLE is active at H-level and internal write instructing signal /WEi is at H-level, control signal φNZ is at H-level, and n-channel MOS transistor NQ in bit line load element 7a is on. In addition, p-channel MOS transistor PQ in bit line load element 7a is turned off in response to activation of word line enable signal WLE. The current driving capability (size: channel width) of n-channel MOS transistor NQ is sufficiently small. In response to activation of word line enable signal WLE, I/O line load circuit 8b is deactivated to stop precharging of internal data bus lines 8aa and 8ab to power supply voltage Vcc level. Before the actual writing of data in the data write mode, n-channel MOS transistor NQ included in bit line load element 7a is on, and p-channel MOS transistor PQ of bit line load element 7a and p-channel MOS transistors Pa and Pb of I/O line load circuit 8b are off.

When external write instructing signal /WE attains the L-level to be active state, internal write instructing signal /WEi attains L-level. Responsively, control signal φNZ attains L-level, and n-channel MOS transistor NQ of bit line load element 7a is turned off. In the data write operation, therefore, MOS transistors NQ and PQ of the bit line load circuit and p-channel MOS transistors Pa and Pb of I/O line load circuit 8b are all off, and the charges present in a parasitic capacitance of each line is held. In response to activation of internal write instructing signal /WEi, a write driver included in write/read circuit 8 shown in FIG. 6 is activated to write data onto selected bit line pair BLP in accordance with the input data signal. In this operation, internal data bus lines 8aa and 8ab of internal data bus 8a are driven to power supply voltage Vcc level and ground voltage Vss level in accordance with the write data. Signal potentials on internal data bus lines 8aa and 8ab are transmitted onto selected bit line pair BLP through column select gate CG provided correspondingly to the selected column. The data is written onto the selected bit line pair through CMOS transmission gates TMa and TMb included in the column select gate. In the example shown in FIG. 10, the bit line onto which data at H-level is read maintains power supply voltage Vcc level, i.e., H-level, and the bit line onto which data at L-level is read is driven to the ground voltage level. During this data writing, bit line load element 7a is off, and I/O line load circuit 8b is also inactive so that a DC current does not flow.

When word line enable signal WLE is deactivated to attain L-level, the write operation is completed. Control signal φNZ attains H-level, both MOS transistors NQ and PQ of bit line load element 7a are turned off, and p-channel MOS transistors Pa and Pb of I/O line load circuit 8b are turned on. The selected word line is driven to the unselected state. Therefore, the bit line and internal data bus line supplied with data at the ground voltage level, i.e., L-level are rapidly precharged to power supply voltage Vcc level.

A data read operation will now be described below. In the data read operation, external write instructing signal /WE maintains H-level, and control signal φNZ maintains H-level. N-channel MOS transistor NQ included in bit line load element 7a maintains the on state. When the address signal changes and word line enable signal WLE is activated, p-channel MOS transistor PQ of bit line load element 7a as well as p-channel MOS transistors Pa and Pb of I/O line load circuit 8b are turned off. In this state, each bit line is connected to the power supply node through n-channel MOS transistor NQ of bit line load element 7a. As for the memory cells connected to the selected word line, the bit line receiving the read data at H-level maintains power supply voltage Vcc level. Meanwhile, the bit line receiving the read data at L-level attains the voltage level of (Vcc−Vth−ΔV) because the column current flows through n-channel MOS transistor NQ of bit line load element 7a. Here Vth represents a threshold voltage of n-channel MOS transistor NQ included in bit line load element 7a. The voltages appearing on the bit lines are transmitted to internal data bus 8a through CMOS transmission gates TMa and TMb. CMOS transmission gates TMa and TMb transmit the voltages without causing a threshold voltage loss. In internal data bus 8a, the internal bus line supplied with data at H-level maintains power supply voltage Vcc level, and the internal data bus line receiving read data at L-level is driven to the voltage level of (Vcc−Vth−ΔV). Then, the sense amplifier included in write/read circuit 8 amplifies data on internal data bus 8a for data reading.

When word line enable signal WLE attains L-level, the selected word line is driven to the unselected state, and the data read operation is completed. Responsively, p-channel MOS transistor PQ included in bit line load element 7a as well as p-channel MOS transistors Pa and Pb included in I/O line load circuit 8b are turned on, and the bit lines and internal data bus lines are rapidly precharged to power supply voltage Vcc level.

FIG. 11 shows by way of example a structure of SRAM cell SMC shown in FIG. 6. In FIG. 11, SRAM cell SMC includes cross-coupled driver transistors DTa and DTb for holding data on storage nodes SNa and SNb, access transistors ATa and ATb for connecting storage nodes SNa and SNb respectively to bit lines BL and /BL in response to the signal on word line WL, and cross-coupled p-channel MOS transistors PUa and PUb for pulling up the voltage levels on storage nodes SNa and SNb, respectively.

Figure 3:
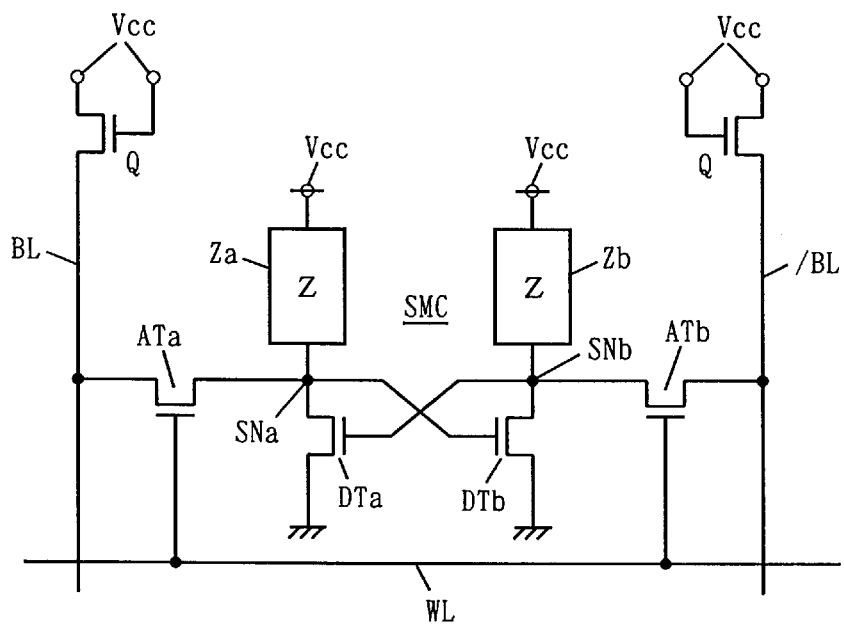
FIG. 3 shows an example of a structure of a memory cell in the semiconductor memory device in the prior art.
Figure 4:
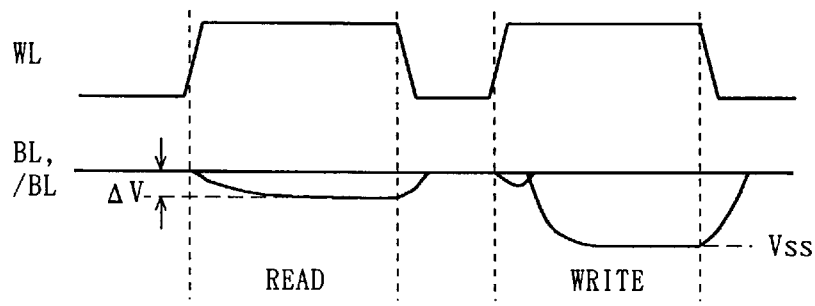
FIG. 4 is a signal waveform diagram representing reading and writing operations of the semiconductor memory device in the prior art.
Figure 5:
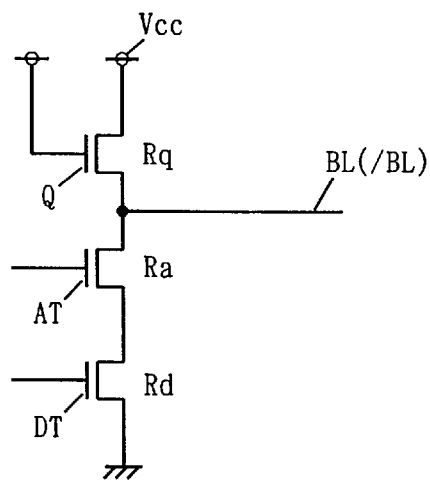
FIG. 5 is an electrically equivalent circuit diagram of a bit line during data reading in the semiconductor memory device in the prior art.

SRAM cell SMC shown in FIG. 11 differs from the SRAM cell of the high-resistance load type shown in FIG. 3 in that p-channel MOS transistors PUa and PUb are employed instead of the high-resistance load element. The pull-up transistor having a gate connected to the storage node holding data at H-level is turned off, and a current path is cut off. Therefore, the current consumption can be reduced, compared with the structure using the SRAM cells of the high-resistance load type. Pull-up transistors PUa and PUb may be formed of thin film transistors (TFTs). Alternatively, the SRAM cells of the high-resistance load type shown in FIG. 3 may be used.

FIG. 12A shows the voltage level which the bit line attains when word line enable signal WLE is inactive. When word line enable signal WLE is at inactive L-level, both MOS transistors PQ and NQ included in bit line load element 7a are on, and the bit line has been precharged to power supply voltage Vcc level. In this state, the internal data bus line has been precharged to power supply voltage Vcc level.

When word line enable signal WLE attains H-level and internal write instructing signal /WEi attains H-level as shown in FIG. 12B, only n-channel MOS transistor NQ is on in bit line load element 7a. In the memory cell, access transistor AT and driver transistor DT for transmitting the data at L-level onto the bit line are on. In this state, the column current flows to lower the voltage level on the bit line to the voltage level of (Vcc−Vth−ΔV). In bit line load element 7a, n-channel MOS transistor NQ holds the on state for the purpose of preventing increase in bit line amplitude due to lowering of the low-level voltage (Vcc−Vth−ΔV) read onto the bit line. Increase in bit line amplitude impedes the fast precharging to power supply voltage Vcc level, i.e., fast recovery after completion of the reading. Since n-channel MOS transistor NQ is provided merely for preventing excessive lowering of the low voltage level on the bit line, its current driving capability (size: channel width) can be made sufficiently small. In this case, therefore, it is possible to provide the bit line amplitude at which flow of a large column current can be prevented and which has an adequately large magnitude.

When word line enable signal WLE attains H-level and internal write instructing signal /WEi attains L-level as shown in FIG. 12C, data is actually written into the memory cell. In this state, bit line load element 7a is inactive, and the bit line is isolated from the power supply node. The bit line receives ground voltage Vss from the write driver, and access transistor AT transfer the ground voltage Vss to the storage node, which in turn is held at ground voltage Vss level by driver transistor.

When the data writing is completed, the state shown in FIG. 12A is attained, and both MOS transistors PQ and NQ of bit line load element 7a are turned on. By increasing the size of p-channel MOS transistor PQ, the voltage level can be rapidly driven from ground voltage Vss level to power supply voltage Vcc level.

By deactivating bit line load element 7a in the data write operation, a DC current can be cut off during data writing. In bit line load element 7a, p-channel MOS transistor PQ is used for recovering the bit line voltage, and is turned off during the data reading and writing. Therefore, p-channel MOS transistor PQ is not concerned with the column current. Therefore, p-channel MOS transistor PQ can have a large size (current driving capability) so that the bit line voltage can be recovered rapidly after completion of the data reading and writing without increasing the current consumption. Even under the low power supply voltage, the bit line read amplitude can be increased by reducing the size of n-channel MOS transistor NQ of the bit line load element, so that accurate data reading can be reliably performed.

Figure 13:
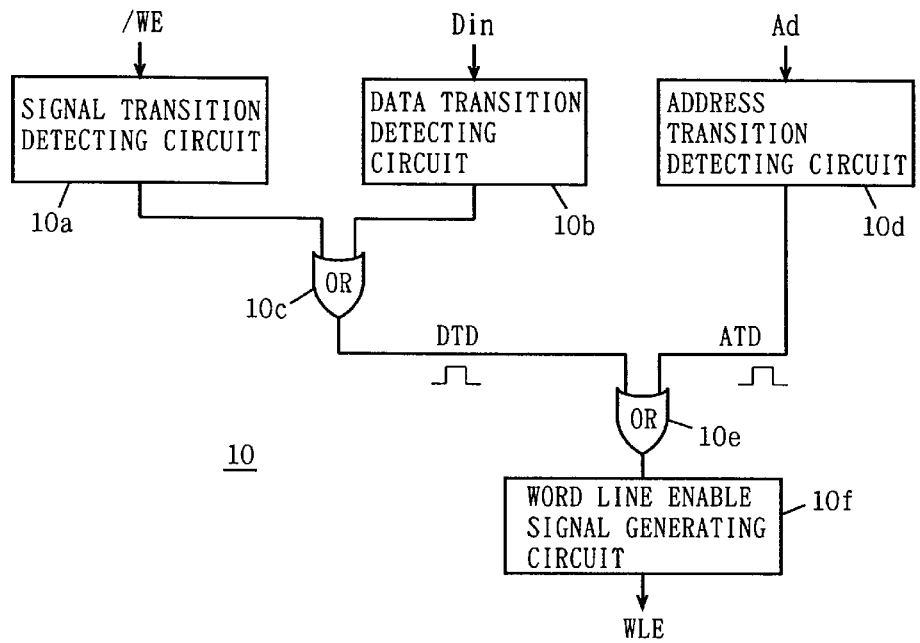
FIG. 13 schematically shows a structure of a main control circuit shown in FIG. 6.

FIG. 13 schematically shows a structure of a word line enable signal generating portion in the main control circuit shown in FIG. 6. In FIG. 13, main control circuit 10 includes a signal transition detecting circuit 10a for detecting transition in external write instructing signal /WE, a data transition detecting circuit 10b for detecting transition in input data Din, an OR circuit 10c for receiving the output signals of signal transition detecting circuit 10a and data transition detecting circuit 10b, an address transition detecting circuit 10d for detecting transition in externally supplied address signal Ad, an OR circuit 10e for receiving data transition detection signal DTD from OR circuit 10c and address transition detection signal ATD from address change detecting circuit 10d, and a word line signal generating circuit 10f for generating word line enable signal WLE in accordance with the output signal of OR circuit 10e.

Transition detecting circuits 10a, 10b and 10d are formed, using known circuits. For example, the transition detecting circuit for one signal is formed of a delay circuit and an EXOR circuit receiving the output of this delay circuit and a corresponding signal. For detecting the transitions in a plurality of signals, the output signals of these match detection circuits (EXORs) are logically ORed to produce the transition detection signal.

OR circuit 10c drives data transition detection signal DTD to the active state for a predetermined period when the operation mode changes as to the data write and read modes or when input data changes. Address transition detecting circuit 10a sets address transition detection signal ATD to the active state, or H-level in FIG. 13, for a predetermined period in response to the address transition. Therefore, OR circuit 10e activates and drives its output signal to H-level when at least one of data transition detection signal DTD and address transition detection signal ATD is activated. Word line enable signal generating circuit 10f is formed of, e.g., fall-delay circuit, and activates word line enable signal WLE by expanding the pulse width of the output signal of OR circuit 10e. Word line enable signal WLE is driven to the active state for a predetermined period when the address changes or when the input data changes in the data write operation.

Structure 2 of Memory Array

Figure 14:
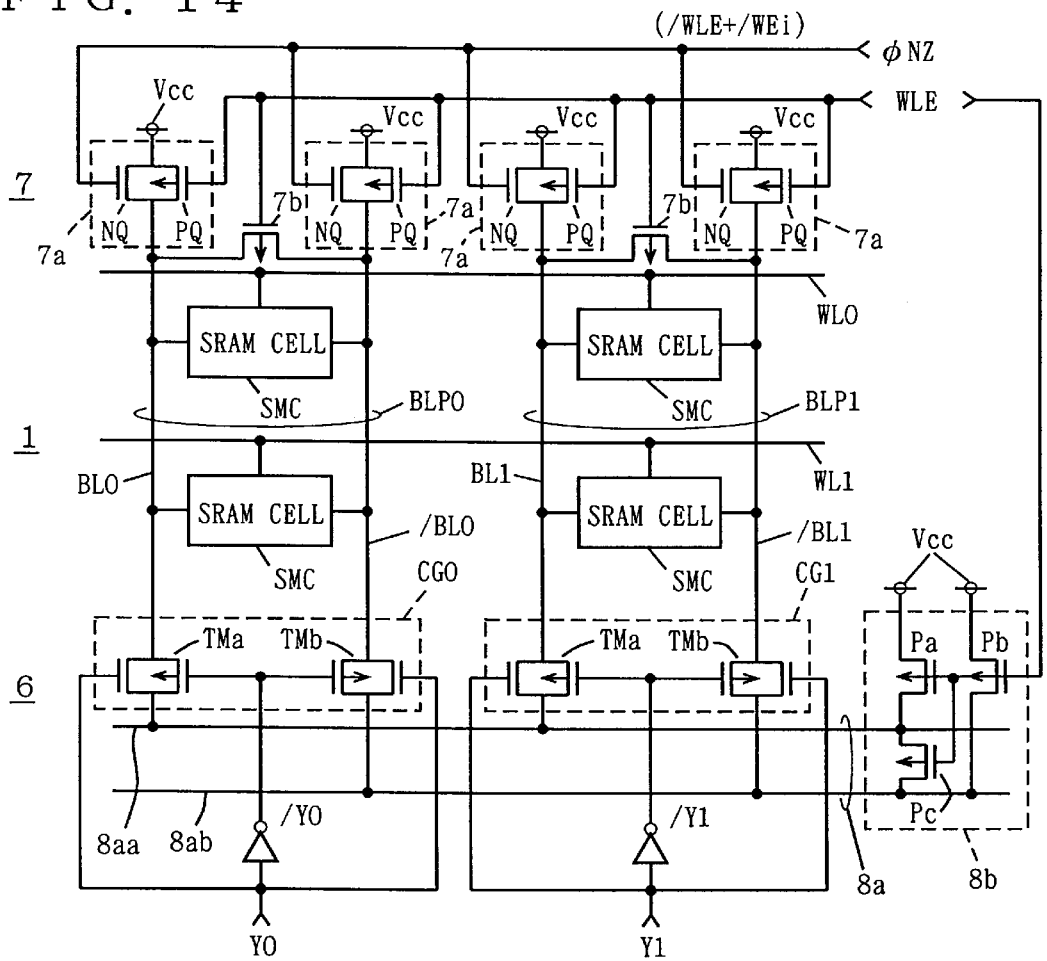
FIG. 14 schematically shows a structure of a second embodiment of the semiconductor memory device shown in FIG. 6.

FIG. 14 shows a second structure of a memory array according to an embodiment of the invention. In the structure shown in FIG. 14, bit line load circuit 7 includes equalizing p-channel MOS transistors 7b provided for bit line pairs BLP0 and BLP1, respectively, and turning on when word line enable signal WLE is inactive. I/O line load circuit 8b includes an equalizing p-channel MOS transistor Pc which is turned on to electrically short-circuit internal data bus lines 8aa and 8ab in response to the inactive state of word line enable signal WLE. Structures other than the above are the same as those shown in FIG. 8, and corresponding parts and portions bear the same reference identifiers.

Figure 15:
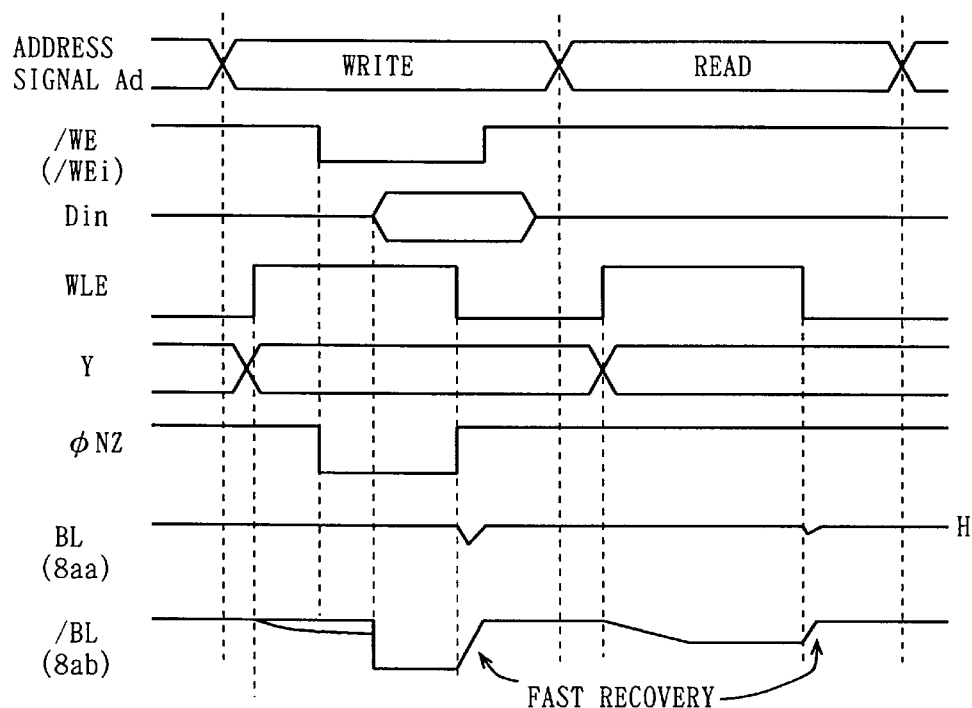
FIG. 15 is a timing chart representing an operation of the semiconductor memory device shown in FIG. 14.

In the structure shown in FIG. 14, when word line enable signal WLE changes from the active state into the inactive state, equalizing p-channel MOS transistors 7b and Pc are turned on to drive rapidly the bit line and the internal data bus line, which have been at L-level, to power supply voltage Vcc level. Now, an operation of the semiconductor memory device shown in FIG. 14 will be described below with reference to a signal waveform diagram of FIG. 15.

First, data writing will be described below. Similarly to the foregoing structure shown in FIG. 8, p-channel MOS transistor PQ included in bit line load element 7a and p-channel MOS transistors Pa and Pb included in I/O line load circuit 8b are off while a word line is in the selected state, or in other words, word line enable signal WLE is at H-level. In this state, p-channel MOS transistor 7b for equalizing the bit lines and p-channel MOS transistor Pc for equalizing the internal data bus lines are off. When write instructing signal /WE (/WEi) attains L-level, n-channel MOS transistor NQ included in the bit line load element is turned off. The bit line (bit line BL in FIG. 15), onto which data at H-level is read, maintains power supply voltage Vcc level, and the voltage level on the bit line (bit line /BL in FIG. 15) onto which data at L-level is read, lowers. Then, the write driver operates in accordance with write data Di, and the voltage level on bit line /BL is driven to the ground level or L-level. Bit line BL is at power supply voltage Vcc level (writing of data at H-level).

When word line enable signal WLE is driven to L-level inactive state to complete the data writing, control signal φNZ rises to H-level, and p- and n-channel MOS transistors PQ and NQ included in bit line load element 7a and p-channel MOS transistors Pa and Pb included in I/O line load circuit 8b are turned on. The voltage levels on bit line /BL and internal data bus line 8ab, which have been at L-level, rise rapidly to power supply voltage Vcc level. At this time, equalizing MOS transistors 7b and Pc are turned on to make electrical short circuits between bit lines BL and /BL and between internal data bus lines 8aa and 8ab. Therefore, the bit line /BL and internal data bus line 8ab which are at L-level are supplied with electric charges from bit line BL and internal data bus line 8aa which are at H-level, respectively, and their voltage levels rise rapidly. Thereby, bit lines BL and /BL as well as internal data bus lines 8aa and 8ab reach power supply voltage Vcc level after equalization of the voltage levels. In this manner, precharging to power supply voltage Vcc level can be performed more rapidly owing to use of equalizing MOS transistors 7b and Pc.

Now, data reading will be described below. In the data read operation, all p-channel MOS transistors PQ, Pa, Pb, Pc and 7b are off while word line enable signal WLE is active. In this state, bit line BL is at power supply voltage Vcc level, and the other bit line /BL is at L-level of (Vcc−Vth−ΔV) level. When word line enable signal WLE is deactivated to complete the data reading, all p-channel MOS transistors PQ, Pa, Pb, Pc and 7b are turned on. Therefore, electrical short circuits are made between bit lines BL and /BL which in turn are at H- and L-levels, respectively, and between internal data bus lines 8aa and 8ab which in turn are at H- and L-levels, respectively, so that the voltage levels on bit line /BL and internal data bus line 8ab held at L-level, rise further rapidly, and are precharged rapidly to power supply voltage Vcc level.

As described above, recovery after completion of the data reading and writing can be performed more rapidly owing to provision of the transistors for equalizing the bit line pair and the internal data bus, respectively.

Structure of Write/Read Circuit

Figure 16:
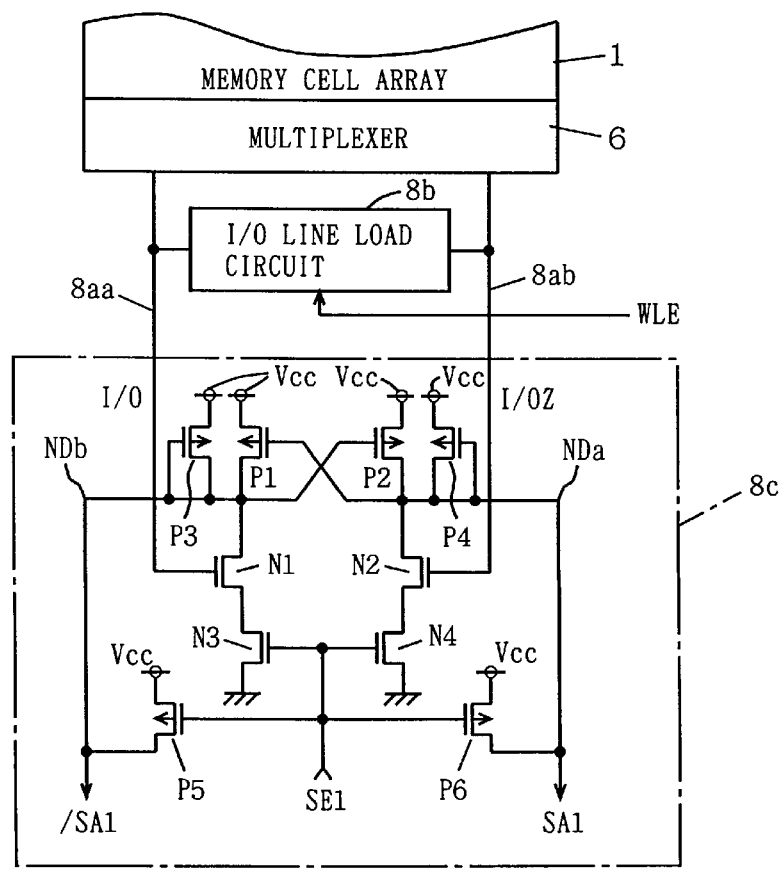
FIG. 16 shows an example of a structure of a write/read circuit shown in FIG. 6.

FIG. 16 shows a structure of the read circuit included in write/read circuit 8 shown in FIG. 6. Write/read circuit 8 includes a cross-coupled type sense amplifier 8c for differentially amplifying signals I/O and I/OZ on internal data bus lines 8aa and 8ab. Cross-coupled type sense amplifier 8c includes p-channel MOS transistor P1 connected between the power supply node and an output node NDb and having a gate connected to an output node NDa, a p-channel MOS transistor P2 connected between the power supply node and output node NDa and having a gate connected to output node NDb, n-channel MOS transistors N1 and N3 connected in series between output node NDb and the ground node, and n-channel MOS transistors N2 and N4 connected in series between output node NDa and the ground node. Gates of n-channel MOS transistors N1 and N2 are connected to internal data bus lines 8aa and 8ab, respectively. Gates of n-channel MOS transistors N3 and N4 receive sense amplifier enable signal SE1.

Cross-coupled type sense amplifier 8c further includes p-channel MOS transistor P3 connected between the power supply node and output node NDb and having a gate connected to output node NDb, a p-channel MOS transistor P4 connected between the power supply node and output node NDa and having a gate connected to output node NDa, and p-channel MOS transistors P5 and P6 turning on, when sense amplifier enable signal SE1 is inactive, to precharge output nodes NDb and NDa to power supply voltage Vcc level. P-channel MOS transistors P1 and P2 have gates and drains cross-coupled with each other, and differentially amplify the voltage levels on output nodes NDa and NDb.

Figure 17:
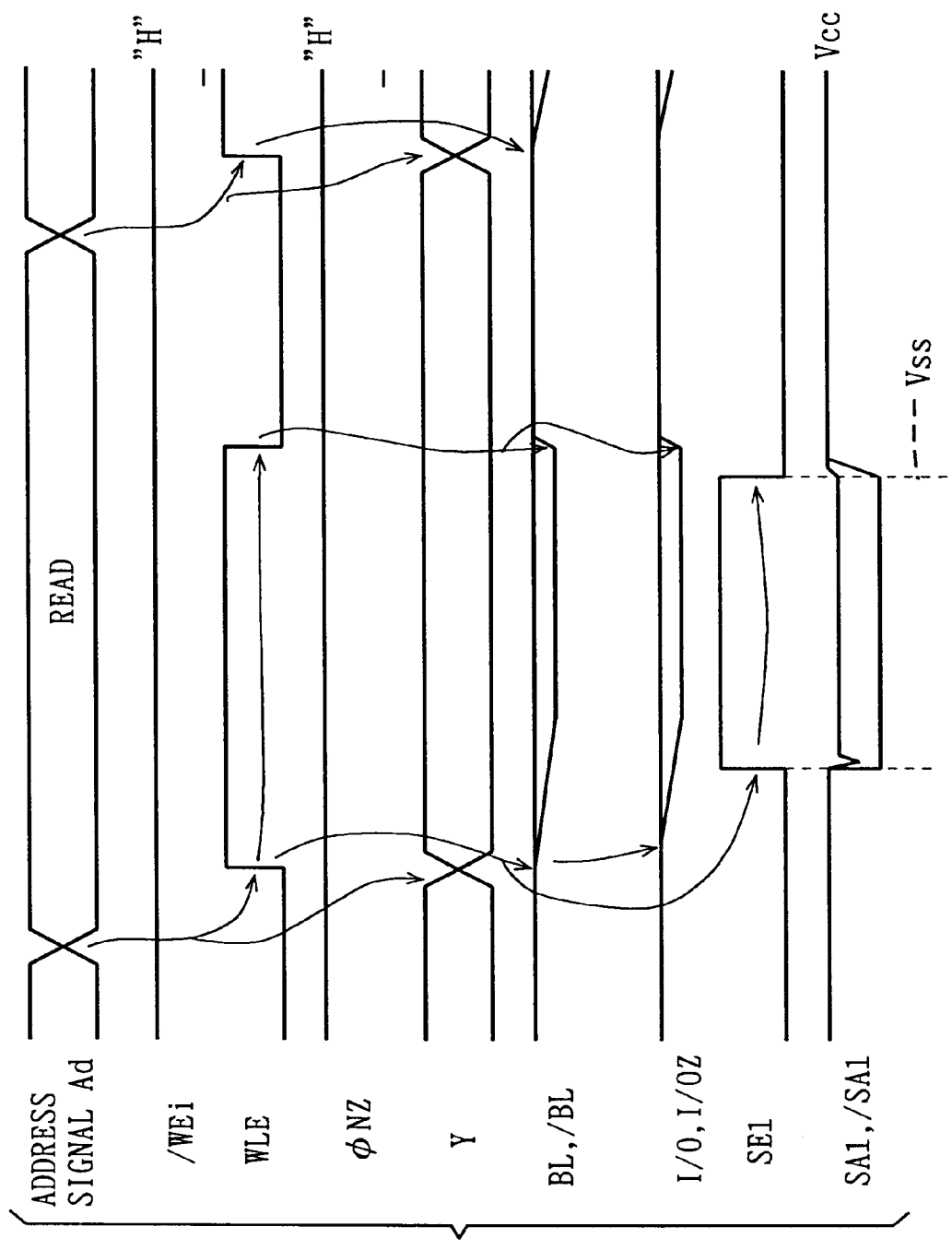
FIG. 17 is a timing chart representing an operation of the write/read circuit shown in FIG. 16.

Structures of I/O line load circuit 8b and the bit line load circuit provided for each bit line in memory cell array 1 are the same as those shown in FIG. 14, and include transistors for equalizing the internal data bus lines and the bit lines. An operation of the cross-coupled type sense amplifier shown in FIG. 16 will be described below with reference to a signal waveform diagram shown in FIG. 17.

Cross-coupled type sense amplifier 8c operates in the data read operation, during which internal write instructing signal /WEi (external write instructing signal /WE) is held at H-level.

When address signal Ad changes, word line enable signal WLE is driven to H-level of active state for a predetermined period and, in accordance with address signal Ad, column select signal Y selecting the addressed column is driven to the active state. In response to activated word line enable signal WLE, data of the memory cells in the addressed row are read onto corresponding bit lines BLs and /BLs, and then selected memory cell data is transmitted onto internal data bus lines 8aa and 8ab through the column select gates in the on state included in multiplexer 6. When internal data bus lines 8aa and 8ab, which have been precharged to power supply voltage Vcc level, are supplied with voltages of Vcc and (Vcc−Vth−ΔV) from selected bit lines BL and /BL, the levels of potentials I/O and I/OZ on internal data bus lines 8aa and 8ab change in accordance with the supplied bit line potentials.

When sense amplifier enable signal SE1 is inactive, p-channel MOS transistors P5 and P6 are on, and output signals SA1 and /SA1 are in the precharged level equal to power supply voltage Vcc level. N-channel MOS transistors N3 and N4 are off so that a current path from the power supply node to the ground node is cut off in cross-coupled type sense amplifier 8c, and the sense operation is not yet performed.

When a difference between data signals I/O and I/OZ read onto internal data bus lines 8aa and 8ab increases to some extent, sense amplifier enable signal SE1 is driven to H-level of active state for a predetermined period. Since the voltage levels on internal data bus lines 8aa and 8ab are relatively high, n-channel MOS transistors N1 and N2 in this cross-coupled type sense amplifier 8c have large conductances so that the voltage levels on output nodes NDa and NDb temporarily lower. Since internal read data signals I/O and I/OZ are at different voltage levels, respectively, the voltage levels on output nodes NDa and NDb lower at different speeds or rates depending on the different voltage levels of internal read data signals I/O and I/OZ, respectively. It is now assumed that internal read data signal I/O is at power supply voltage Vcc level, and internal read data signal I/OZ is at L-level equal to the voltage level of (Vcc−Vth−ΔV). In this state, output node NDb is rapidly discharged through MOS transistors N1 and N3 so that the voltage level of signal /SA1 from output node NDb lowers. Meanwhile, the current flowing through n-channel MOS transistors N2 and N4 is relatively small so that the voltage level of signal SA1 from output node NDa lowers slowly.

When the voltage level on output node NDb lowers, p-channel MOS transistor P2 is first turned on to supply a current to output node NDa so that the voltage level of signal SA1 on output node NDa rises. In accordance with rising of the voltage level on output node NDa, p-channel MOS transistor P1 maintains the off state, and signal /SA1 from output node NDb lowers to L-level. Signal SA1 from output node NDa is pulled up by p-channel MOS transistor P2, and returns to H-level. In this state, MOS transistors P3 and P4 each function as a pull-up element to suppress lowering of signal /SA1 to ground voltage Vss level. The voltage level of signal SA1 from output node NDa is held at the voltage level of (Vcc−Vth) by transistor P4. Owing to the pull-up function of p-channel MOS transistors P3 and P4, the latching of cross-coupled p-channel MOS transistors P1–P2 is weakened, and the recovery time of output nodes NDa and NDb is shortened.

When sense amplifier enable signal SA1 falls to L-level upon completion of the data reading, n-channel MOS transistors N3 and N4 are turned off, and p-channel MOS transistors P5 and P6 are turned on so that signals SA1 and /SA1 from output nodes NDa and NDb are driven to power supply voltage Vcc level again.

Then, word line enable signal WLE is deactivated to attain L-level, and bit lines BL and /BL in memory cell array 1 as well as internal data bus lines 8aa and 8ab return rapidly to power supply voltage Vcc level.

By using cross-coupled type sense amplifier 8c, the sensing operation can be performed rapidly and reliably even when a potential difference between internal data buses 8aa and 8ab (bit lines BL and /BL) is small. This is because the feedback of p-channel MOS transistors P1 and P2 is a negative feedback so that the voltage difference between output nodes NDa and NDb is rapidly amplified. In a structure including a circuit of a current mirror type, an n-channel MOS transistor at a comparison stage receives on its gate a signal at a relatively high voltage level, and has a conductance made large so that relatively large currents flow through both the master stage and the slave stage of the current mirror stage. In the structure using the differential amplifier of the current mirror type, therefore, a gain of the amplifier circuit of the current mirror type is reduced and cannot perform fast and accurate amplification if both the voltage levels of signals I/O and I/OZ on internal data bus lines 8aa and 8ab are high, because the operation region falls outside the "strike zone" where the sense amplifier of the current mirror type has the best sensitivity. By using the cross-coupled type sense amplifier 8c, the fast amplification can be reliably performed even when the voltage levels on the bus lines 8aa and 8ab change after internal data bus lines 8aa and 8ab are precharged to power supply voltage Vcc level, and the width of this voltage change is small (one of the cross-coupled p-channel MOS transistors maintains the off state).

In the structure with the differential amplifier of the current mirror type, the master transistor at the current mirror stage is diode-connected, and the voltage amplitude on the drain node of this diode-connected MOS transistor is small. Therefore, it is difficult to produce a differential signal pair with the current mirror type differential amplifier. However, by using the cross-coupled type sense amplifier as shown in FIG. 16, it is possible to produce a differential signal pair having a relatively large signal amplitude.

As described above, a small signal amplitude can be reliably amplified to produce the differential signal pair owing to the cross-coupled type sense amplifier in the read circuit, as shown in FIG. 16.

Figure 18:
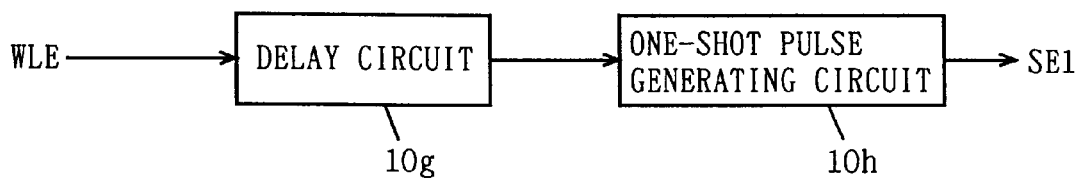
FIG. 18 schematically shows a structure of a portion for generating a sense amplifier activating signal shown in FIG. 16.
Figure 2:
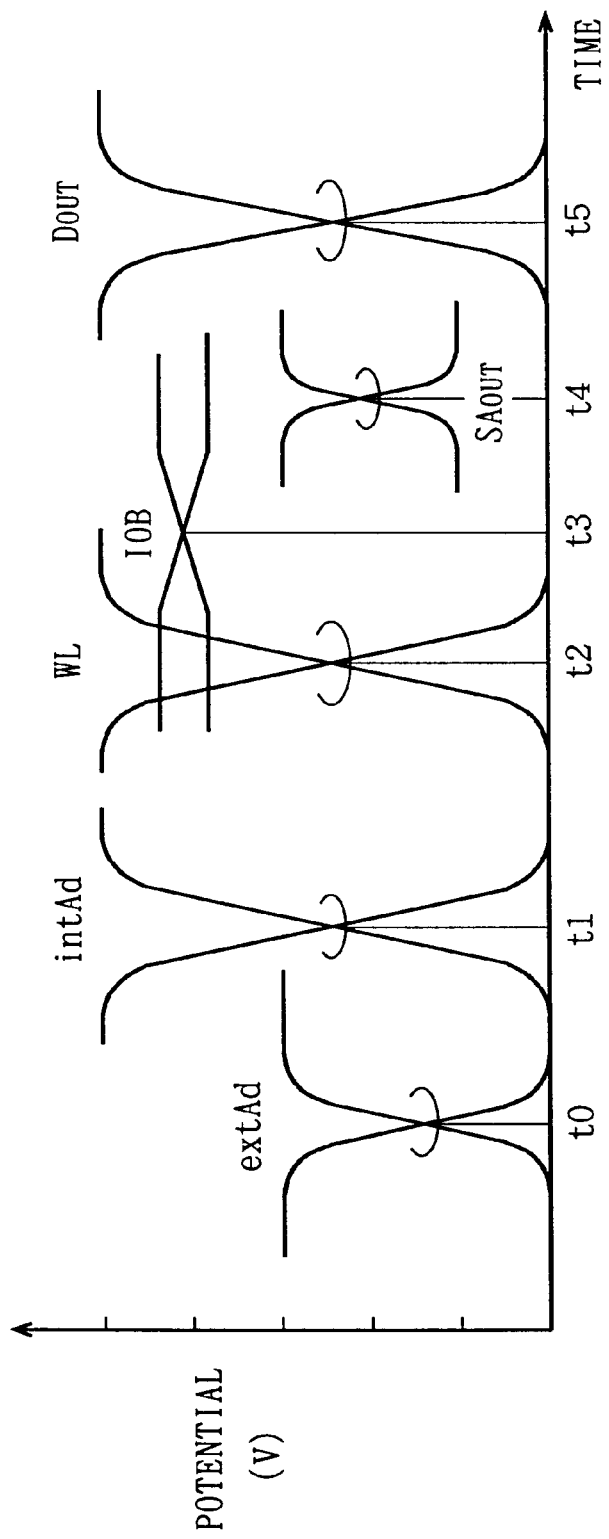
FIG. 2 is a signal waveform diagram representing an operation for data reading of the semiconductor memory device in the prior art.

FIG. 18 schematically shows a structure of a circuit generating a sense amplifier enable signal. This sense amplifier enable signal generating portion is included in main control circuit 10 shown in FIG. 6. In FIG. 18, the sense amplifier enable signal generating portion includes a delay circuit 10g for delaying word line enable signal WLE by a predetermined period, and a one-shot pulse generating circuit 10h for generating a one-shot pulse signal having a predetermined time width in response to rising of the output signal of delay circuit 10g.

In the structure shown in FIG. 18, when word line enable signal WLE is activated, the memory cell data is transmitted onto the internal data bus line. Thereafter, the output signal of delay circuit 10g rises, and the sense amplifier enable signal SE1 generated by one-shot pulse generating circuit 10h is driven to H-level for a predetermined period. By controlling the delay time of delay circuit 10g, it is possible to activate the sense amplifier when the potential difference between the internal data bus lines sufficiently after transmission of the memory cell data onto the internal data bus lines.

Structure 2 of Read Circuit

Figure 19:
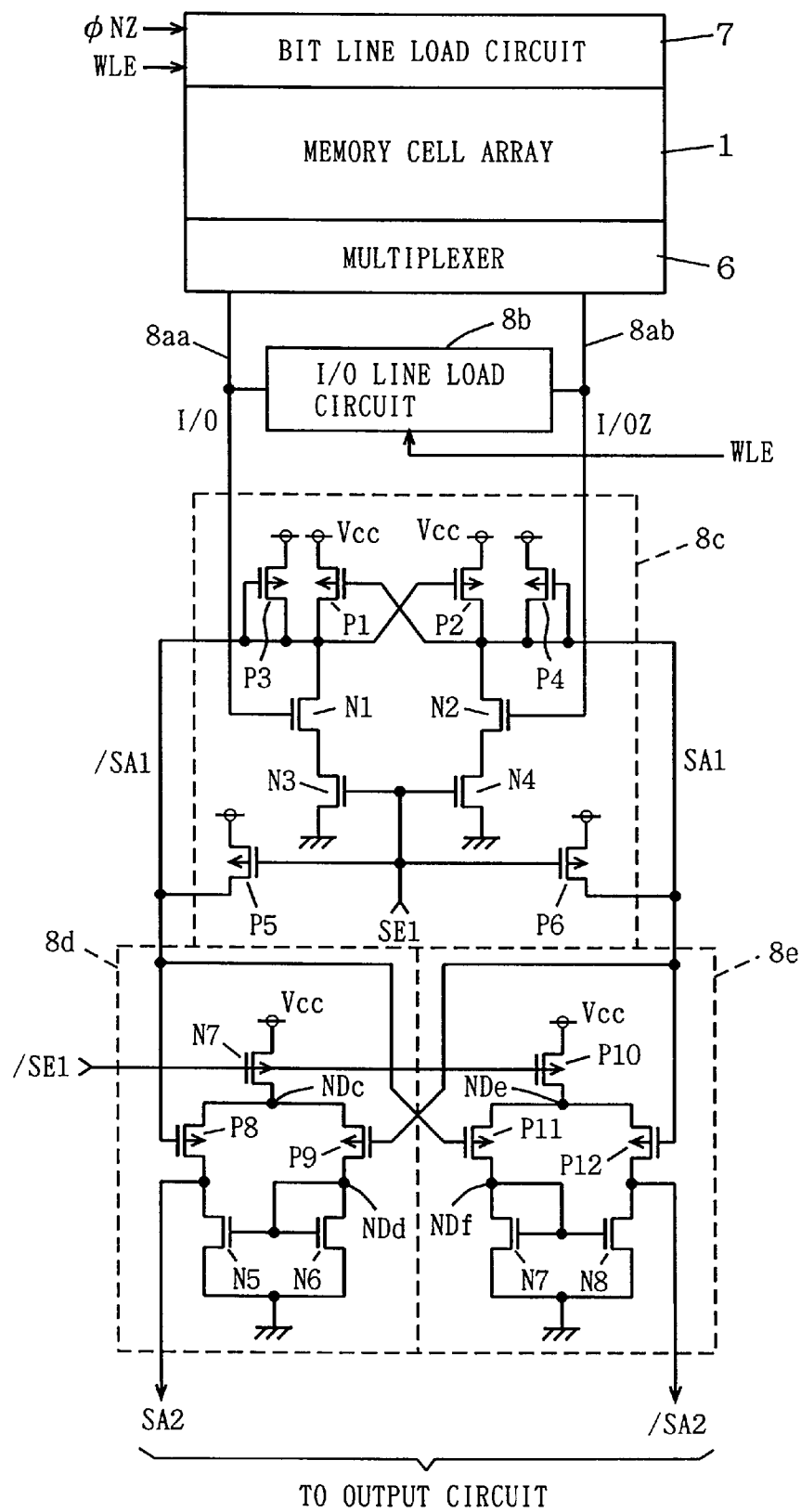
FIG. 19 shows a second structure of a read portion in the write/read circuit shown in FIG. 6.

FIG. 19 shows a second structure of the read circuit. In the structure shown in FIG. 19, the read circuit includes the current mirror type differential amplifiers 8d and 8e which differentially amplify output signals SA1 and /SA1 of cross-coupled type sense amplifier 8c for conversion into signals at CMOS levels. Current mirror type differential amplifier 8d includes a p-channel MOS transistor P7 connected between the power supply node and a node NDc and turning on in response to activation (L-level) of sense amplifier enable signal /SE1, p- and n-channel MOS transistors P8 and N5 connected in series between node NDc and the ground node, and p- and n-channel MOS transistors P9 and N6 connected in series between node NDc and the ground node. P-channel MOS transistor P8 receives output signal /SA1 of cross-coupled type sense amplifier 8c on its gate, and p-channel MOS transistor P9 receives output signal SA1 of cross-coupled type sense amplifier 8c on its gate. Gates of n-channel MOS transistors N5 and N6 are connected to a drain node NDd of n-channel MOS transistor N6.

Current mirror type differential amplifier 8e includes a p-channel MOS transistor P10 connected between the power supply node and a node NDe and turning on in response to activation of sense amplifier enable signal /SE1, p- and n-channel MOS transistors P11 and N7 connected in series between node NDe and the ground node, and p- and n-channel MOS transistors P12 and N8 connected in series between node NDe and the ground node. P-channel MOS transistor P11 receives output signal /SA1 of cross-coupled type sense amplifier 8c on its gate, and p-channel MOS transistor P12 receives output signal SA1 of cross-coupled type sense amplifier 8c on its gate. Gates of n-channel MOS transistors N7 and N8 are connected to a drain node NDf of n-channel MOS transistor N7.

Figure 20:
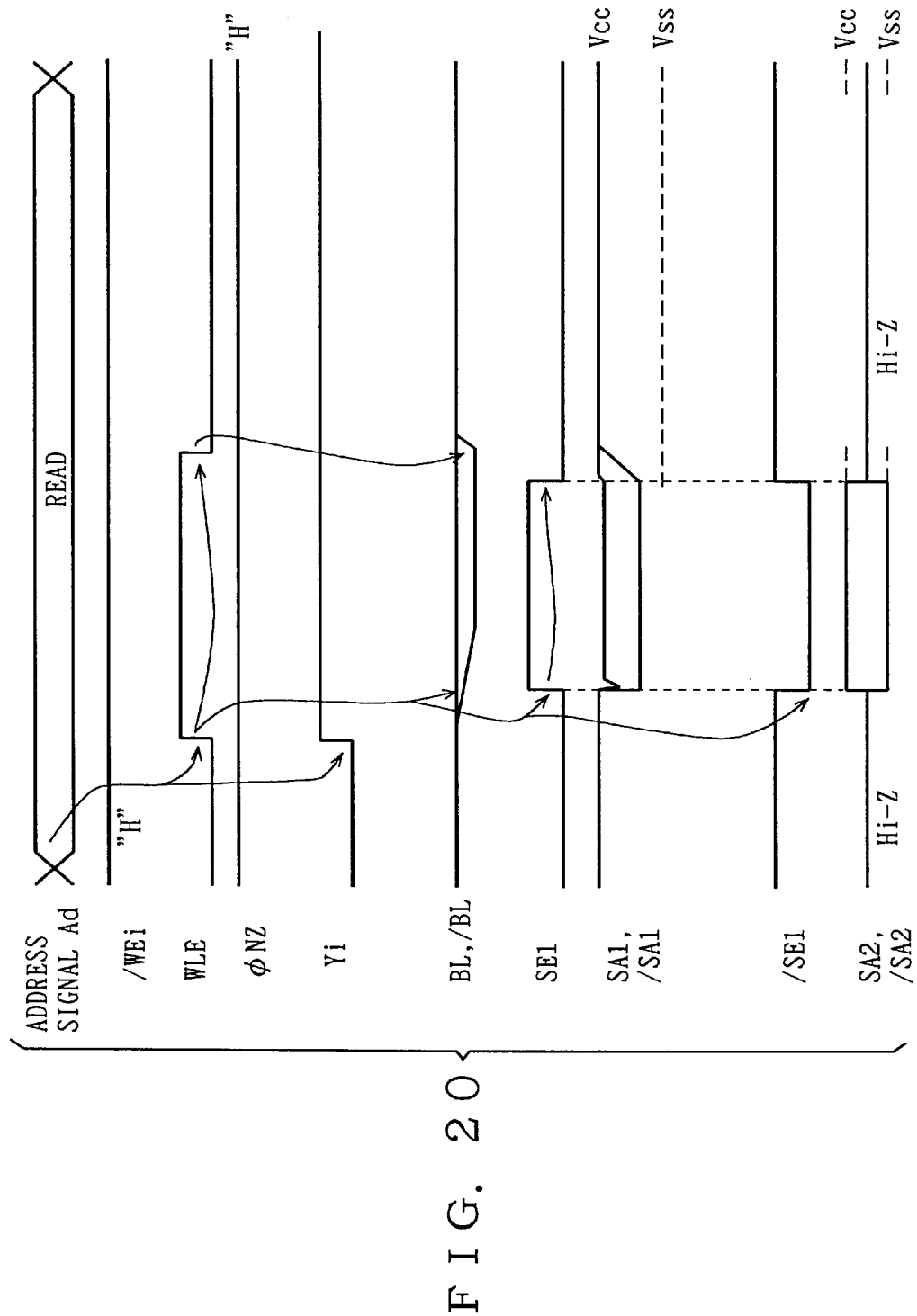
FIG. 20 is a timing chart representing an operation of the read circuit shown in FIG. 19.

In the current mirror type differential amplifiers 8d and 8e, p-channel MOS transistors P7 and P10 operate as current source transistors. P-channel MOS transistors P8 and P9 as well as p-channel MOS transistors P11 and P12 form the differential amplifier stages, respectively. N-channel MOS transistors N5 and N6 as well as n-channel MOS transistors N7 and N8 form current mirror stages, respectively. Now, an operation of the read circuit shown in FIG. 19 will be described below with reference to operation waveform diagram of FIG. 20.

In data reading, word line enable signal WLE is driven to the active state, column select signal Yi corresponding to the selected column is driven to the active state in accordance with the address signal, and data on bit lines BL and /BL is transmitted onto internal data bus lines 8aa and 8ab, respectively. Then, sense amplifier enable signal SE1 is driven to the active state, and cross-coupled type sense amplifier 8c performs sensing to produce complementary output signals SA1 and /SA1. A series of these operations is the same as that described in connection with the read circuit shown in FIG. 16.

When sense amplifier enable signal /SE1 is at H-level, no current path is present in the current mirror type differential amplifiers 8d and 8e, and internal nodes thereof are in a floating state of the high impedance state. When sense amplifier enable signal SE1 attains H-level, sense amplifier enable signal /SE1 attains L-level of active state so that the current mirror type differential amplifiers 8d and 8e start the differential amplification. It is now assumed that signal SA1 is at H-level, and signal /SA1 is at L-level. In the current mirror type differential amplifier 8d, p-channel MOS transistor P8 maintains the substantially off state, and p-channel MOS transistor P9 is turned on to supply a current to n-channel MOS transistor N6. N-channel MOS transistors N5 and N6 form the current mirror circuit. If n-channel MOS transistors N5 and N6 have the same size, currents of the same magnitude flow through MOS transistors N5 and N6, respectively. Therefore, signal SA2 which has been in the high impedance state is rapidly discharged to ground voltage Vss level. In current mirror type differential amplifier 8e, signal /SA1 is substantially at power supply voltage Vcc level (precisely, the voltage level of (Vcc−Vth)), and p-channel MOS transistor P11 is off. Meanwhile, p-channel MOS transistor P12 is turned on. Therefore, a current does not flow to n-channel MOS transistors N7 and N8 forming the current mirror stage so that p-channel MOS transistor P12 drives signal /SA2 to power supply voltage Vcc level. Thereby, complementary signals SA2 and /SA2 at the CMOS levels can be produced.

By forming complementary signals SA2 and /SA2 at the CMOS levels from complementary signals SA1 and /SA1 at the intermediate levels, data can be read stably.

When a predetermined period elapses, sense amplifier enable signal SE1 falls to L-level, and sense amplifier enable signal /SE1 attains H-level so that the sense operation is completed. Responsively, signals SA1 and /SA1 return to power supply voltage Vcc level, and signals SA2 and /SA2 return to the high impedance state.

Structure 3 of Read Circuit

Figure 21:
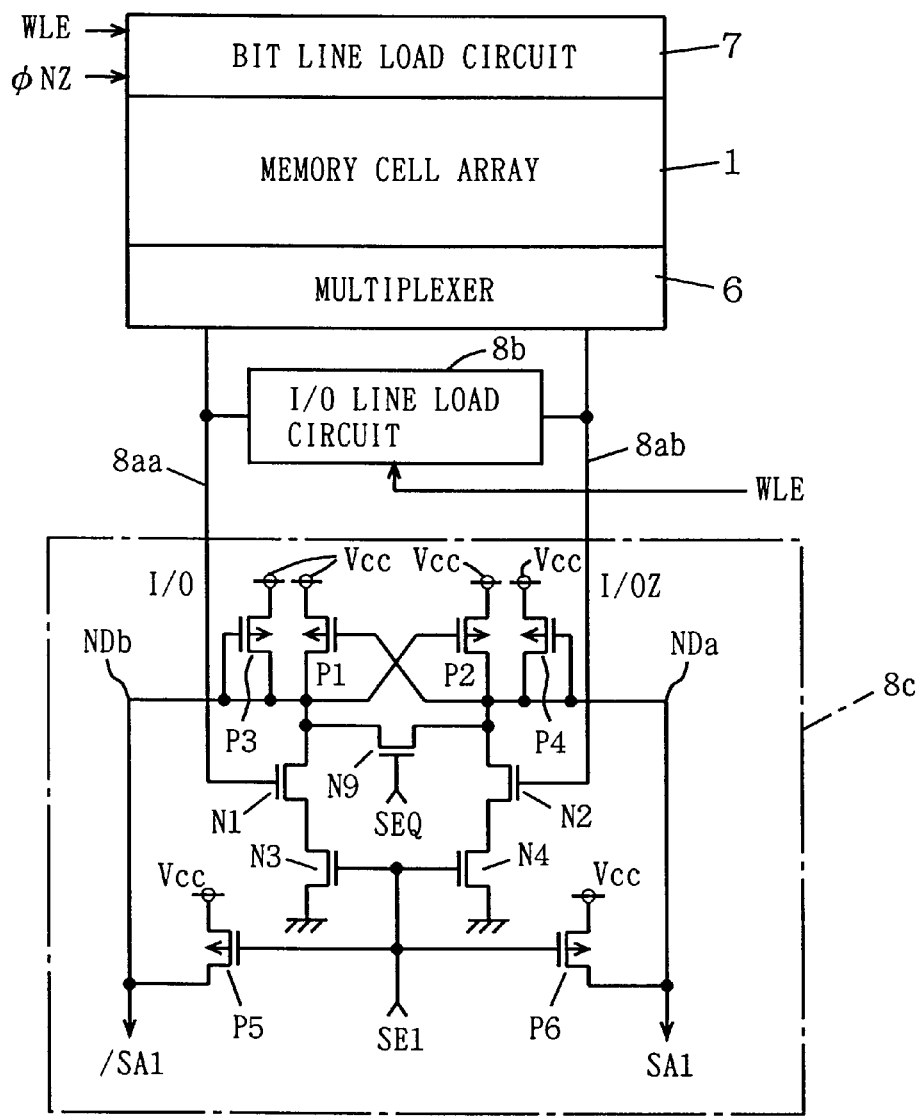
FIG. 21 shows a third structure of the read portion in the write/read circuit shown in FIG. 6.

FIG. 21 shows a third structure of the read circuit. More specifically, FIG. 21 shows a structure of the cross-coupled type sense amplifier 8c included in the read circuit. Cross-coupled type sense amplifier 8c shown in FIG. 21 differs from cross-coupled type sense amplifier 8c shown in FIG. 16 in that an n-channel MOS transistor N9 is provided for equalizing output nodes NDa and NDb for a predetermined period when the sensing operation starts. Structures other than the above description are the same as those in FIG. 16. The corresponding portions bear the same reference identifiers, and will not be described below.

An operation of the read circuit shown in FIG. 21 will be described below with reference to a signal waveform diagram of FIG. 22. In the data read operation, address signal Ad changes, word line enable signal WLE is activated for a predetermined period, and data of the selected memory cell is transmitted onto internal data bus lines 8aa and 8ab. These operations are the same as those in the description of the read circuit shown in FIG. 16. When sense amplifier enable signal SE1 is activated, precharging of output nodes NDa and NDb to power supply voltage Vcc level is completed. N-channel MOS transistors N3 and N4 are turned on, and cross-coupled type sense amplifier 8c starts the sensing. In response to this activation of sense amplifier activating signal SE1, an equalize instructing signal SEQ attains H-level, and n-channel MOS transistor N9 is turned on to electrically short-circuit output nodes NDa and NDb.

In accordance with the signals transmitted onto internal data bus lines 8aa and 8ab, the conductances of n-channel MOS transistors N1 and N2 rapidly increase, and signals SA1 and /SA1 from output nodes NDa and NDb temporarily lower to a low level. Then, as a result of this equalization, one of p-channel MOS transistors P1 and P2 slowly pulls up the voltage levels on output nodes NDa and NDb. When sense amplifier equalize instructing signal SEQ is deactivated to attain L-level, output nodes NDa and NDb are electrically isolated. In this state, the voltage difference between internal data bus lines 8aa and 8ab has sufficiently increased, and cross-coupled type sense amplifier 8c accurately performs the sensing in accordance with the signal voltage levels on internal data bus lines 8aa and 8ab, drive signals SA1 and /SA1 to H- and L-levels, respectively.

As described above, when sense amplifier enable signal SE1 is active, MOS transistors N1 and N2 receive on their gates the signals at relatively high voltage levels, and have large conductance so that they rapidly lower the voltage levels on output nodes NDa and NDb. When the voltage difference between internal data bus lines 8aa and 8ab is small, there is a possibility that reverse data is output. This reverse data is produced, for example, due to variations in threshold voltage of MOS transistors P1, P2, N1 and N2, or rapid discharging of nodes NDa and NDb. When correct data is output after output of the reverse data, fast reading is impossible because a certain time is required before output of the correct data. In particular, the reverse data is further amplified by the current mirror type differential amplifier at the subsequent state. Therefore, a long time is required before the output of correct data from the current mirror type differential amplifier so that fast reading is impossible.

At the start of the sensing, however, equalizing n-channel MOS transistor N9 is turned on to equalize the voltage levels on output nodes NDa and NDb, whereby the output of reverse data is prevented. By starting the sensing after a sufficiently large voltage difference occurs between internal read signals I/O and I/OZ on internal data bus lines 8aa and 8ab, internal read data signals SA1 and /SA1 can be accurately produced without producing the reverse data.

Figure 23:
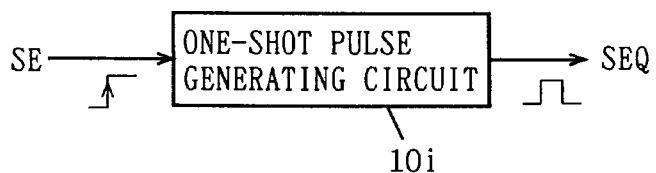
FIG. 23 schematically shows a structure of a portion for generating a sense amplifier equalize instructing signal shown in FIG. 21.

FIG. 23 shows a structure of the portion for generating the sense amplifier equalize instructing signal. This sense amplifier equalize instructing signal generating portion is included in main control circuit 10 shown in FIG. 6. In FIG. 23, the sense amplifier equalize instructing signal generating portion includes a one-shot pulse generating circuit 10i generating a one-shot pulse activated to attain H-level for a predetermined period in response to rising of sense amplifier enable signal SE. One-shot pulse generating circuit 10i is implemented by a known structure including a delay circuit and a logical gate. By utilizing one-shot pulse generating circuit 10i, sense amplifier instructing signal SEQ can be driven to the active state at H-level for a predetermined period when the sense amplifier is made active.

As described above, the output nodes are electrically short-circuited for a predetermined period when the cross-coupled type sense amplifier starts the sensing. Therefore, it is possible to prevent output of the reverse data at the start of sensing, and fast data reading can be performed.

Structure 4 of Read Circuit

Figure 24:
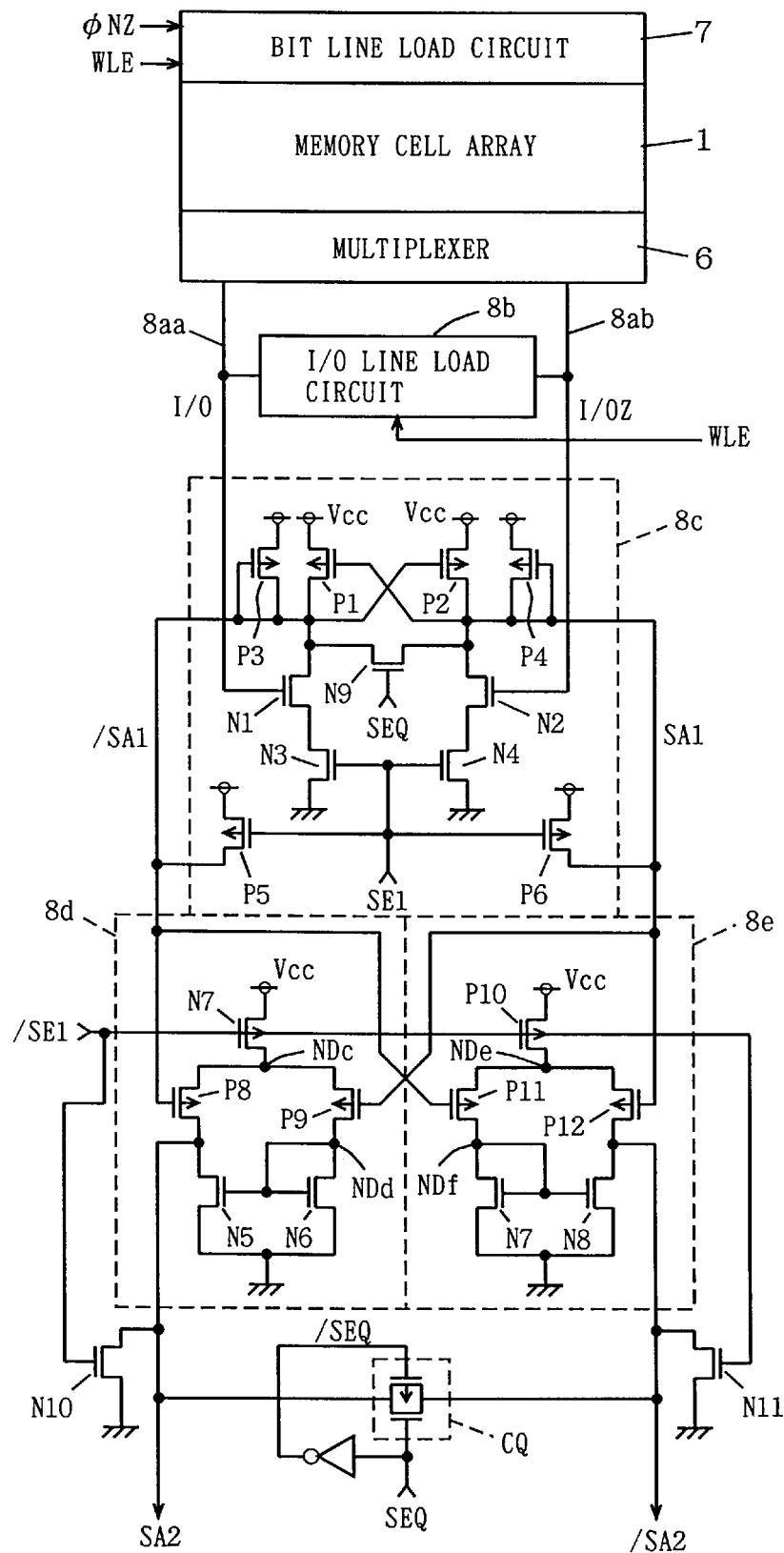
FIG. 24 shows a fourth structure of a data read portion in the write/read circuit shown in FIG. 6.

FIG. 24 shows a fourth structure of the read circuit. The structure shown in FIG. 24 includes n-channel MOS transistors N10 and N11 for driving the output nodes of current mirror type differential amplifiers 8d and 8e to the ground voltage level when sense amplifier enable signal /SE1 is inactive (H-level), and an equalize element CQ for electrically short-circuiting the output nodes of current mirror type differential amplifiers 8d and 8e in response to sense amplifier equalize instructing signals SEQ. and /SEQ. Structures other than these elements are the same as those shown in FIGS. 19 and 21. Corresponding portions bear the same reference identifiers, and will not be described below.

Equalize element CQ includes an n-channel MOS transistor turning on in response to activation of the sense amplifier equalize instructing signal SEQ, and a p-channel MOS transistor turning on in response to activation (L-level) of sense amplifier equalize instructing signal /SEQ. Now, an operation of the read circuit shown in FIG. 24 will be described below with reference to an operation waveform diagram of FIG. 25.

Address signal Ad changes, and word line enable signal WLE becomes active for a predetermined period. Then, column select signal Yi is driven to the active state, and memory cell data of the selected column is transmitted onto internal data bus lines 8aa and 8ab through bit lines BL and /BL, respectively. This operation is the same as that described in connection with the read circuit shown in FIG. 21. In the cross-coupled type sense amplifier 8c, the output nodes thereof are equalized for a predetermined period in response to activation of sense amplifier enable signal SE1, and thereafter the sense operation starts so that generation of the reverse data is inhibited.

In the current mirror type differential amplifiers 8d and 8e, output signals SA2 and /SA2 thereof hold the ground voltage level when sense amplifier enable signal /SE1 is at H-level. Therefore, the ground voltage level of output signals SA2 and /SA2 of current mirror type differential amplifier 8d and 8e is the sensing operation start voltage level. When sense amplifier enable signal SE1 is activated, MOS transistors N10 and N11 are turned off. Meanwhile, equalize element CQ holds output signals SA2 and /SA2 at the same voltage level for a predetermined period in response to equalize instructing signals SEQ and /SEQ when differential amplifiers 8d and 8e start the operation, respectively. In this state, therefore, both the output signals of cross-coupled type sense amplifier 8c have already fallen to L-level, and the voltage levels of output signals SA2 and /SA2 of current mirror type differential amplifiers 8d and 8e slowly rise, respectively.

When sense equalize instructing signals SEQ and /SEQ are deactivated after elapsing of a predetermined time, output signals SA1 and /SA1 of cross-coupled type sense amplifier 8c are rapidly driven to H- and L-levels, respectively. Responsively, current mirror type differential amplifiers 8d and 8e differentially amplify the signals SA1 and /SA1, and rapidly drive signals SA2 and /SA2 to power supply voltage Vcc level and ground voltage Vss level, respectively.

Current mirror type are provided at their output nodes with pull-down n-channel MOS transistors N10 and N11, respectively, so that the output nodes of the current mirror type differential amplifiers 8d and 8e are held at the ground voltage level when sense amplifier enable signal /SE1 is at H-level. Thereby, the output nodes of the current mirror type differential amplifiers 8d and 8e does not attain the high impedance state so that data reading can be accurately performed without a variation in voltage level at the start of the operation.

Since equalize element CQ equalizes output signals SA2 and /SA2 for a predetermined time at the time of start of the sensing operation, output signals SA1 and /SA1 of cross-coupled type sense amplifier 8c attain the same voltage levels so that output of the reverse data can be prevented, and accurate data reading can be performed.

By using the read circuit shown in FIG. 24, data reading can be performed accurately and rapidly even when the power supply voltage is low and the voltage difference between the signals on internal data bus lines 8aa and 8ab is small.

In the structure shown in FIG. 24, one n-channel MOS transistor N9 is employed for equalizing the output nodes of cross-coupled type sense amplifier 8c, and the CMOS transmission gate is employed for equalizing the output nodes of differential amplifiers 8d and 8e of the current mirror type. This is based on the following reasons. Although only a small layout area is available for the equalize element provided for one cross-coupled type sense amplifier, a sufficiently large layout area can be utilized for the equalize element provided for the two current mirror type differential amplifiers. Therefore, the cross-coupled type sense amplifiers 8c may likewise include a CMOS transmission gate as the equalize element for the output nodes if an enough area is available. The use of CMO transmission gate can increase the conductance of the equalize element and accurate equalizing can be achieved.

As described above, the output nodes of the cross-coupled type sense amplifier and the current mirror type differential amplifier are precharged to power supply voltage Vcc level and ground voltage Vss level, respectively, whereby the voltage level at the time of start of the operation can always be constant, and the accurate sense operation can be performed. By equalizing the output nodes for a predetermined period at the time of start of sensing, output of reverse data can be prevented, and fast data reading can be performed.

Structure of I/O Circuit

Figure 26:
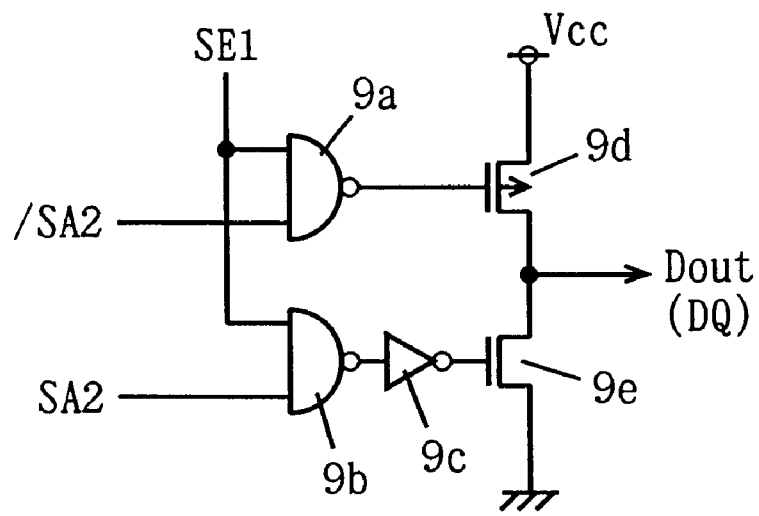
FIG. 26 schematically shows a structure of an output circuit in the I/O circuit shown in FIG. 6.

FIG. 26 shows a structure of the output circuit of I/O circuit 9 shown in FIG. 6. In FIG. 26, the output circuit includes a NAND circuit 9a for receiving sense amplifier enable signal SE1 and output signal /SA2 of the current mirror type differential amplifier 8e of the current mirror type, a NAND circuit 9b for receiving sense amplifier enable signal SE1 and output signal SA2 of the current mirror type differential amplifier 8d, an inverter 9c receiving the output signal of NAND circuit 9b, and p-channel MOS transistors 9d and 9e connected in series between the power supply node and the ground node. The output signal of NAND circuit 9a is supplied to a gate of p-channel MOS transistor 9d, and the output signal of inverter 9c is supplied to a gate of n-channel MOS transistor 9e.

The output circuit having the structure shown in FIG. 26 receives output signals SA2 and /SA2 at the CMOS levels from the current mirror type differential amplifiers 8d and 8e. When sense amplifier enable signal SE1 is inactive at L-level, the output signal of NAND circuit 9a is at H-level, and the output signal of inverter 9c is at L-level so that both MOS transistors 9d and 9e are off, and the output node is held in the high impedance state.

When the sensing operation starts and the sense amplifier enable signal is driven to the active state, output data Dout (or DQ) is produced in accordance with signals SA2 and /SA2. When signal SA2 is at H-level, the output signal of inverter 9c attains H-level, and the output signal of NAND circuit 9a attains H-level and responsively MOS transistors 9d and 9e are turned off and on, respectively, and output data Dout attains L-level. When signal SA2 is at L-level, the output signal of inverter 9c attains L-level, the output signal of NAND circuit 9a attains L-level, and output data Dout attains power supply voltage Vcc level or H-level.

Even when sense amplifier enable signal SE1 is applied to the data output circuit, both signals SA2 and /SA2 are at L-level during the equalization of the output nodes of current mirror type differential amplifiers, and both MOS transistors 9d and 9e are off during this equalization period, to maintain the output circuit in the output high impedance state and output of reverse data is prevented. The data output circuit may be supplied with a signal which is activated after completion of equalization of the sense amplifiers.

Figure 27:
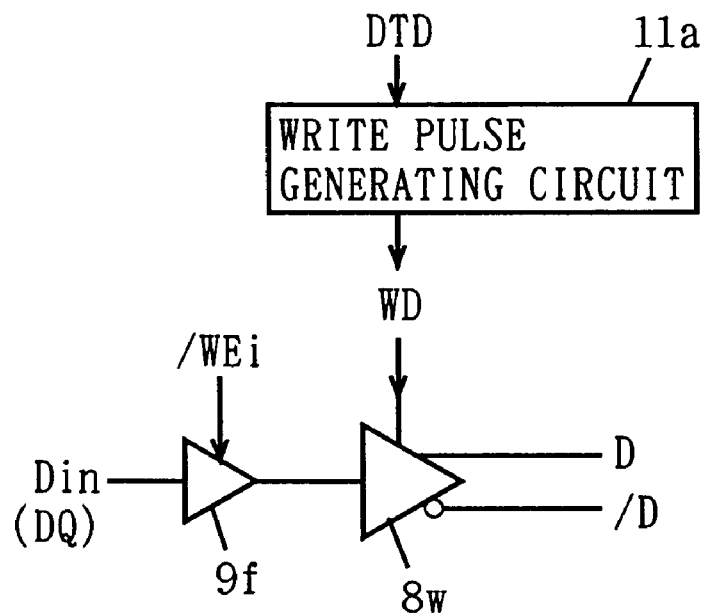
FIG. 27 schematically shows a structure of a portion related to data writing in the semiconductor memory device shown in FIG. 6.

FIG. 27 shows a structure of the data write portion. In FIG. 27, the structure for data writing includes an input buffer 9f activated to buffer an externally supplied data, or input data Din in response to activation of internal write instructing signal /WEi, and a write driver 8w producing complementary write data D and /D according to the write data received from input buffer 9f in response to a write pulse signal WB from a write pulse generator 11a which in turn is activated for a predetermined period in response to activation of data transition detection signal DTD. Input buffer 9f is included in I/O circuit 9. Write driver 8w is included in write/read circuit 8 (FIG. 6). Write pulse generator 11a is included in write/read control circuit 11 shown in FIG. 6.

In the structure shown in FIG. 27, a write drive pulse WD generated from write pulse generator 11a is driven to H-level for a predetermined period when change in write data generated from input buffer 9f is detected, and write drive circuit 8w produces complementary write data D and /D. Thus, it is possible to prevent transmission of reverse data onto the internal data bus, and the internal data bus and bit line pair can be reliably driven in accordance with the externally supplied write data.

Other Applications

In the above semiconductor memory device, one cross-coupled type sense amplifier is provided for memory cell array 1. However, memory cell array 1 may be divided into a plurality of column blocks each including a plurality of columns, in which arrangement a cross-coupled type sense amplifier may be provided for each column block, and a differential amplifier of the current mirror type may be provided commonly for the plurality of cross-coupled type sense amplifiers. In this arrangement, only the cross-coupled type sense amplifier provided for the selected column block is activated in accordance with a column block designating signal and a sense amplifier enable signal.

Input and output of data, which is performed one bit at a time in the foregoing embodiment, may be performed multiple bits in parallel at a time, in which arrangement the write/read circuit already described may be provided for each bit, and multiple bit line pairs are simultaneously selected.

According to the invention, as described above, the load element having the CMOS structure, and having current driving capability thereof controlled depending on the operation mode, is used as the load element for each bit line. Even under the low power supply voltage, therefore, a sufficiently large bit line amplitude can be formed, and accurate data reading can be performed. Also, in the data write operation, it is possible to prevent occurrence of the DC current, and therefore a low current consumption can be achieved.

By employing the cross-coupled type sense amplifier as the sense amplifier for data reading, a minute potential difference can be amplified fast to produce a complementary signal pair. By amplifying the output signals of this cross-coupled type sense amplifier by the current mirror type the differential amplifier, the signal pair at the CMOS levels can be accurately produced.

By equalizing the output nodes of the differential amplifiers or the sense amplifiers for a predetermined period at the time of start of sensing, it is possible to prevent output of reverse data, and stable and fast data reading can be achieved.

By precharging the output nodes of the sense amplifiers or the differential amplifiers to predetermined levels, the voltage levels at the time of start of operation can always made constant so that the sensing operation does not start at instable voltage levels, and data sensing can be performed accurately.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory cells arranged in rows and columns;

a plurality of word lines arranged corresponding to said rows, respectively, each of the word lines connecting to the memory cells in a corresponding row;

a plurality of pairs of bit lines arranged corresponding to said columns, respectively, each of the bit line pairs connecting to the memory cells in a corresponding column;

a plurality of bit line load elements provided corresponding to the bit lines, respectively, each of the bit line load elements being connected between a corresponding bit line and a power supply node and including an insulated gate field effect transistor of a first conductivity type and an insulated gate field effect transistor of a second conductivity type connected in parallel between the corresponding bit line and the power supply node;

a control circuitry for controlling a load of each respective bit line load element on a corresponding bit line in response to a data write instructing signal and a word line enable instructing signal, said control circuitry including a circuit for turning off the insulated gate field effect transistors of the first and second conductivity types when said data write instructing signal and said word line enable signal are active, and turning off said insulated gate field effect transistor of the first conductivity type in response to activation of said word line enable signal; and a read circuitry for reading out data of an addressed memory cell in a data read mode of operation.

2. The semiconductor memory device according to claim 1, further comprising:

bit line equalize elements provided corresponding to the plurality of bit line pairs for equalizing potentials on corresponding bit line pairs in response to deactivation of said word line enable signal, respectively.

3. The semiconductor memory device according to claim 1, wherein said read circuitry includes:

a pair of internal read data lines for transmitting data of the addressed memory cell, and a bus equalize element for equalizing potentials on the internal read data line pair in response to deactivation of said word line enable signal.

4. The semiconductor memory device according to claim 1, wherein said read circuitry includes:

a pair of internal read data lines for transmitting data of the addressed memory cell, and a precharge element for precharging the internal read data line pair to a predetermined potential in response to deactivation of said word line enable signal.

5. The semiconductor memory device according to claim 1, wherein said read circuitry includes:

a pair of internal read data lines for transmitting data of the addressed memory cell in the data read mode of operation, and cross-coupled type sense amplifier coupled to the internal read data line pair, for differentially amplifying potentials on the internal read data line pair to produce signals complementary to each other on a pair of output nodes thereof in response to a sense amplifier enable signal, the cross-coupled type sense amplifier including a set of cross-coupled insulated gate field effect transistors of the first conductivity type.

6. The semiconductor memory device according to claim 5, wherein said cross-coupled type sense amplifier includes:

a comparison stage for comparing the potentials on said internal read data line pair;

said set of the cross-coupled insulated gate field effect transistors coupled between said power supply node and said comparison stage for amplifying an output of said comparison stage for outputting to the output node pair; and a pull-up element for pulling up potentials on said output node pair to a voltage level on said power supply node.

7. The semiconductor memory device according to claim 5, wherein said cross-coupled type sense amplifier further includes a drive element for driving the output node pair of said cross-coupled type sense amplifier to the voltage level on said power supply node in response to deactivation of said sense amplifier enable signal.

8. The semiconductor memory device according to claim 5, wherein said cross-coupled type sense amplifier further includes a sense equalize element for electrically short-circuiting the pair of output nodes of said cross-coupled type sense amplifier for a predetermined period in response to activation of said sense amplifier enable signal.

9. The semiconductor memory device according to claim 5, wherein said read circuitry further includes:

a pair of current mirror type differential amplifiers provided corresponding to the output node pair of the cross-coupled type sense amplifier, for differentially amplifying the potentials on said output node pair, said pair of the current mirror type differential amplifier performing differential amplification of the potentials on the output node pair of said cross-coupled sense amplifier complementarily to each other in response to activation of said sense amplifier enable signal.

10. The semiconductor memory device according to claim 9, wherein said read circuitry further includes an output precharge element for precharging an output node of each of said pair of the current mirror type differential amplifiers to a voltage level different from the voltage level on said power supply node in response to deactivation of said sense amplifier enable signal.

11. The semiconductor memory device according to claim 9, wherein said read circuitry further includes:

an equalize element for equalizing the potentials on the output nodes of said pair of the current mirror type differential amplifiers for a predetermined period in response to activation of said sense amplifier enable signal.

12. The semiconductor memory device according to claim 1, wherein the field effect transistor of the second conductivity type of each of said bit line load elements has a current driving capability smaller than a current driving capability of the field effect transistor of the first conductivity type in a corresponding bit line load element.

13. The semiconductor memory device according to claim 1, wherein each of the memory cells is a static memory cell including a set of cross-coupled transistors as a memory element.

14. The semiconductor memory device according to claim 11, wherein said equalize element includes a CMOS transmission gate for turning on for a predetermined period in response to activation of said sense amplifier enable signal.

15. The semiconductor memory device according to claim 8, wherein said sense equalize element includes an insulated gate field effect transistor of the second conductivity type.

16. The semiconductor memory device according to claim 9, wherein said read circuitry further includes an output circuit for buffering data signals received from the current mirror type differential amplifiers to produce an external data for external outputting when activated in response to the sense amplifier enable signal.

* * * * *